(12) United States Patent
Ito et al.

(10) Patent No.: US 9,608,178 B2
(45) Date of Patent: Mar. 28, 2017

(54) SEMICONDUCTOR LIGHT EMITTING DEVICE

(75) Inventors: Hisataka Ito, Osaka (JP); Toshitaka Nakamura, Osaka (JP); Hironaka Fujii, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 13/165,036

(22) Filed: Jun. 21, 2011

(65) Prior Publication Data

US 2011/0309384 A1 Dec. 22, 2011

(30) Foreign Application Priority Data

Jun. 22, 2010 (JP) ................................ 2010-141215

(51) Int. Cl.
*H01L 29/18* (2006.01)
*H01L 33/00* (2010.01)
(Continued)

(52) U.S. Cl.
CPC ............ *H01L 33/54* (2013.01); *H01L 33/505* (2013.01); *H01L 33/507* (2013.01);
(Continued)

(58) Field of Classification Search
CPC ... H01L 2224/8592; H01L 2224/73265; H01L 33/507; H01L 2224/45144;
(Continued)

(56) References Cited

U.S. PATENT DOCUMENTS

| 6,774,401 B2 | 8/2004 | Nakada et al. |
| 7,334,907 B2 | 2/2008 | Nagayama |

(Continued)

FOREIGN PATENT DOCUMENTS

| CN | 1674316 A | 9/2005 |
| CN | 101124683 A | 2/2008 |

(Continued)

OTHER PUBLICATIONS

Japanese Office Action dated Nov. 26, 2013, issued by the Japan Patent Office in corresponding Japanese Application No. 2010-141215.

(Continued)

*Primary Examiner* — Meiya Li
(74) *Attorney, Agent, or Firm* — Sughrue Mion, PLLC

(57) ABSTRACT

The present invention relates to a semiconductor light emitting device including: a substrate for element mounting; a wiring provided on the substrate; an LED element provided on the substrate and electrically connected to the wiring; an encapsulating resin layer for encapsulating the LED element; and a wavelength conversion layer which contains a phosphor material and converts a wavelength of light emitted by the LED element, in which the wavelength conversion layer is provided on an upper side of the LED element, and a diffusive reflection resin layer is provided in a state that side faces of the LED element are surrounded therewith, and an area at the LED element face side of the wavelength conversion layer is at least twice larger by area ratio than an area of light emitting area on an upper surface of the LED element.

6 Claims, 12 Drawing Sheets

(51) Int. Cl.
*H01L 33/54* (2010.01)
*H01L 33/50* (2010.01)

(52) U.S. Cl.
CPC ............ *H01L 2224/45144* (2013.01); *H01L 2224/48091* (2013.01); *H01L 2224/48247* (2013.01); *H01L 2224/73265* (2013.01); *H01L 2224/8592* (2013.01)

(58) Field of Classification Search
CPC ....... H01L 2224/48091; H01L 2924/00; H01L 2924/00014; H01L 2224/48247; H01L 33/505; H01L 33/54
USPC .................. 257/E33.061, E27.12, 79–104
See application file for complete search history.

(56) References Cited

U.S. PATENT DOCUMENTS

| | | | |
|---|---|---|---|
| 8,029,152 B2 | 10/2011 | Sekine et al. | |
| 8,106,584 B2 | 1/2012 | Tabuchi et al. | |
| 8,469,530 B2 | 6/2013 | Ito et al. | |
| 8,742,433 B2 | 6/2014 | Ajiki et al. | |
| 2004/0036079 A1* | 2/2004 | Nakada et al. | 257/81 |
| 2005/0219835 A1 | 10/2005 | Nagayama | |
| 2006/0034084 A1* | 2/2006 | Matsuura | H01L 33/507 362/293 |
| 2007/0205425 A1* | 9/2007 | Harada | H01L 33/58 257/98 |
| 2007/0267643 A1* | 11/2007 | Harada | H01L 33/58 257/98 |
| 2008/0179617 A1* | 7/2008 | Kadotani et al. | 257/98 |
| 2008/0186714 A1 | 8/2008 | Nagayama | |
| 2008/0265749 A1* | 10/2008 | Bechtel et al. | 313/503 |
| 2008/0290351 A1* | 11/2008 | Ajiki et al. | 257/88 |
| 2009/0081100 A1 | 3/2009 | Suzuki et al. | |
| 2009/0155943 A1 | 6/2009 | Krames et al. | |
| 2009/0295265 A1 | 12/2009 | Tabuchi et al. | |
| 2009/0296367 A1 | 12/2009 | Sekine et al. | |
| 2010/0246160 A1 | 9/2010 | Ito et al. | |
| 2011/0001148 A1* | 1/2011 | Sun | H01L 33/60 257/88 |
| 2014/0077237 A1 | 3/2014 | Ajiki et al. | |

FOREIGN PATENT DOCUMENTS

| | | | |
|---|---|---|---|
| CN | 101283457 A | 10/2008 | |
| CN | 101325195 A | 12/2008 | |
| EP | 1381091 A2 | 1/2004 | |
| JP | 2002-270904 A | 9/2002 | |
| JP | 2004-055632 * | 2/2004 | ............ H01L 33/00 |
| JP | 3655267 B2 | 3/2005 | |
| JP | 2005-277227 A | 10/2005 | |
| JP | 2006-066657 A | 3/2006 | |
| JP | 2006-282447 A | 10/2006 | |
| JP | 2007-150331 A | 6/2007 | |
| JP | 2007-227868 A | 9/2007 | |
| JP | 2008-199000 A | 8/2008 | |
| JP | 2008-210960 A | 9/2008 | |
| JP | 2009-099759 A | 5/2009 | |
| JP | 2009283438 A | 12/2009 | |
| TW | I 311803 B | 7/2009 | |
| WO | 2006/101174 A1 | 9/2006 | |
| WO | 2009066670 A1 | 5/2009 | |

OTHER PUBLICATIONS

Office Action dated Aug. 20, 2013, issued by the Japanese Patent Office in corresponding Application No. 2010-141215.

Communication from the State Intellectual Property Office of P.R. China dated Dec. 26, 2014 in a counterpart application No. 201110179949.9.

Office Action dated Mar. 27, 2015, issued by the Taiwan Intellectual Property Office in counterpart Taiwanese Application No. 100121859.

* cited by examiner

BACKGROUND ART

BACKGROUND ART

SEMICONDUCTOR LIGHT EMITTING DEVICE

CROSS REFERENCE TO RELATED APPLICATIONS

The present application is based on Japanese Patent Application No. 2010-141215 filed on Jun. 22, 2010, and the contents are incorporated herein by reference.

All references cited herein are incorporated by reference herein in their entirety.

Also, all references cited herein are incorporated as a whole.

FIELD OF THE INVENTION

The present invention relates to a semiconductor light emitting device. More particularly, it relates to a semiconductor light emitting device having a light emitting diode (LED), particularly a blue LED or a near-ultraviolet LED, that converts the wavelength of a part or all of emission of the LED to emit white light or other visible light.

BACKGROUND OF THE INVENTION

As one of visible light sources for displaying or lighting, there is a light emitting device using a blue LED or a near-ultraviolet LED based on a gallium nitride-based compound semiconductor such as GaN, GaAlN, InGaN, or InAlGaN. In the light emitting device, white light or other visible light emission can be obtained by using a phosphor material which absorbs a part or all of the emission from the LED as excitation light and converts the wavelength into visible light having a longer wavelength. Particularly, a white LED has been recently widely applied to various indicators, light sources, display devices, and backlights for liquid crystal displays and its use is begun to extend to headlamps for automobiles and general lighting.

Packaging methods of the light emitting device are diversified depending on individual uses and required properties but a "surface-mounting type" capable of surface mounting on a printed wiring board is one of the most mainstream methods. FIG. 20 is a schematic view showing a configuration of a general surface-mounted LED element. A wiring pattern (lead) 32 is formed on the surface of a printed wiring board 31 including a resin or a ceramic material, and an LED element 33 is mounted on the wiring pattern 32 via an adhesive 34 such as a silver paste. An upper electrode of the LED element 33 is connected to another lead 32 with a wire 35 such as a gold wire. In order to protect the wire 35 and the LED element 33, an encapsulating resin is filled to form an encapsulating resin layer 36. In the encapsulating resin layer 36, a powdery phosphor 37 is dispersed. 38 is a reflector, which is provided on the board 31 and becomes a fence for forming the encapsulating resin layer 36 by filling the encapsulating resin as well as has an action to reflect the light emitted from the LED element 33 or the phosphor 37 toward a light extraction direction X side to efficiently utilize the light.

Moreover, as a packaging method of the light emitting device, as shown in FIG. 21, a type where the encapsulating resin layer 39 is formed in a state that only the LED element 33 is covered (chip-coated type) is also in practical use. In this regard, in the chip-coated type in the above FIG. 21, a phosphor (not shown in the figure) is dispersed in the encapsulating resin layer 39 at a high concentration but, in the surface-mounted type in the above FIG. 20, the phosphor 37 is usually dispersed in the encapsulating resin layer 36 at a low concentration.

The following will describe an emission principle of a white LED which is formed by combining a blue LED and a yellow phosphor (generally, a YAG:Ce phosphor). Namely, when electric power is supplied to an LED element from a pair of leads, blue emission takes place. The blue light is transmitted through the encapsulating resin layer but is, on the way, absorbed by the phosphor dispersed in the encapsulating resin layer in a part, whereby the wavelength is converted into yellow color one. As a result, from the semiconductor package, the blue light and the yellow light are radiated in a mixed state but the mixed light is perceived as white color by human eyes. This is an emission principle of the white LED.

Here, when the concentration of the phosphor used is too high, the yellow light becomes too much and a strongly yellowish white color is obtained. On the other hand, when the amount of the phosphor is too small, a bluish white color is obtained. Moreover, even when the phosphor is dispersed in the encapsulating resin at the same concentration, emission color fluctuation occurs owing to various causes such as unevenness in thickness of the encapsulating resin and heterogeneous precipitation of the phosphor during a period until the encapsulating resin is cured. Therefore, it is one problem in the production process of the white LED how to reduce the emission color fluctuation attributable to the arrangement of the phosphor.

Moreover, since the light emitted from the LED element and the phosphor is usually natural light which is radiated to all directions without directivity, the emitted light is radiated not only to the light extraction direction of the package but also to the wiring board side which is an opposite direction, the reflector side, and the like evenly. On this occasion, when a light absorptive material is used in the surface of the wiring board or in the surface of the reflector, the light cannot be efficiently reflected and returned to the light extraction direction. Accordingly, it is devised to impart a reflective function having diffuse reflectivity to the surface of the wiring board or the reflector.

For example, Patent Document 1 proposes a method of mixing a filler for light reflection into an insulating paste for covering the periphery of an LED except for the surface facing to the light emitting direction. Also, there is a description that thermal conductivity of the insulating paste is improved and heat generated from the LED is efficiently radiated to the substrate by mixing the filler. Patent Document 2 proposes an improving method for solving the problem that a resin layer containing a filler for light reflection climbs up to the LED emission surface to lower the emission intensity of the LED in the production step of a light emitting device having a surface-mounted package structure. Patent Document 3 discloses a light emitting device having a structure that all surfaces except for a light exit surface of LED is confined by covering with a resin having a diffuse reflection effect to radiate light only from the light exit surface and having a structure that the light exit surface is covered with a resin containing a phosphor. Patent Document 4 proposes a contrivance that, at the time when the propagating direction of the emitted light from an LED is limited by a resin material having a diffuse reflection effect, a light extraction effect is further improved and luminance is enhanced by setting a forming method thereof to a position lower than a junction position to be provided on the LED.

Patent Document 1: JP-A-2002-270904
Patent Document 2: Japanese Patent No. 3655267
Patent Document 3: JP-A-2005-277227
Patent Document 4: JP-A-2008-199000

SUMMARY OF THE INVENTION

Incidentally, FIG. 22 is a schematic view showing behavior of the light emitted at the wavelength conversion layer 41 at the time when the excitation light from an LED enters into the wavelength conversion layer (emitter layer). Usually, since the wavelength conversion layer 41 is formed of a material where phosphor particles are dispersed in a resin, light scattering by the phosphor particles occurs. Namely, as shown in FIG. 22, a part of the excitation light A from the LED and a part of the light (emitted light) B emitted at the wavelength conversion layer 41 propagate to the direction opposite to the light extraction direction to become back scattering light C. D is the light propagating to the light extraction direction. In the methods of the above Patent Documents 1 to 4, a contrivance for enhancing a light extraction efficiency is made by reflecting the emitted light from the LED or the emitted light from a color conversion layer. However, since a contrivance is not made with focusing the back scattering light C particularly in the color conversion layer and from the viewpoint of enhancing the extraction efficiency, the effect is restricted.

Thus, in order to reduce the back scattering light C as far as possible and improve the light extraction efficiency, there is recently investigated a method for improving transparency of the wavelength conversion layer 41 by transforming the phosphor to nanoparticle one or increasing the absorbance of the phosphor itself to reduce the amount of the resistive element to be added. However, when the transmittance of the wavelength conversion layer 41 is improved and the diffusivity decreases, as shown in FIG. 23, in addition to the back scattering light C, confinement of the light D propagating to the light extraction direction occurs by total internal reflection attributable to the difference in refractive index between the wavelength conversion layer 41 and an outer region thereof, so that the light extraction efficiency cannot be sufficiently improved. E is confined light due to total internal reflection.

The present invention is conducted in consideration of such circumstance and an object thereof is to provide a semiconductor light emitting device excellent in light extraction efficiency.

Namely, the present invention relates to the following items (1) to (8).

(1) A semiconductor light emitting device including:
a substrate for element mounting;
a wiring provided on the substrate;
an LED element provided on the substrate and electrically connected to the wiring;
an encapsulating resin layer for encapsulating the LED element; and
a wavelength conversion layer which contains a phosphor material and converts a wavelength of light emitted by the LED element,
in which the wavelength conversion layer is provided on an upper side of the LED element, and a diffusive reflection resin layer is provided in a state that side faces of the LED element are surrounded therewith, and
an area at the LED element face side of the wavelength conversion layer is at least twice larger by area ratio than an area of light emitting area on an upper surface of the LED element.

(2) The semiconductor light emitting device according to (1), in which the wavelength conversion layer is a phosphor plate which includes a translucent ceramic including a polycrystalline sintered body whose sintered density is 99.0% or more, having a total light transmittance of 40% or more in a visible light wavelength region excluding an excitation wavelength region, and having a thickness of 100 to 1,000 μm.

(3) The semiconductor light emitting device according to (1), in which the wavelength conversion layer is a phosphor sheet being formed by dispersing phosphor particles into a binder resin, having a total light transmittance of 40% or more in a visible light wavelength region excluding an excitation wavelength region, and having a thickness of 50 to 200 μm.

(4) The semiconductor light emitting device according to any one of (1) to (3), in which the diffusive reflection resin layer is formed from a cured material of a resin composition containing a transparent resin and an inorganic filler different in refractive index from the transparent resin, and a diffuse reflectance of the diffusive reflection resin layer is 80% or more at the wavelength of 430 nm.

(5) The semiconductor light emitting device according to any one of (1) to (4), in which the area at the LED element face side of the wavelength conversion layer is at least five times larger by area ratio than the area of light emitting area on the upper surface of the LED element.

(6) The semiconductor light emitting device according to any one of (1) to (4), in which the area at the LED element face side of the wavelength conversion layer is at least twenty times larger by area ratio than the area of light emitting area on the upper surface of the LED element.

(7) The semiconductor light emitting device according to any one of (1) to (6), in which the wavelength conversion layer is either one composed of a single wavelength conversion layer or one formed by laminating a plurality of wavelength conversion layers.

(8) The semiconductor light emitting device according to (7), in which a plurality of the LED elements are provided and the number of the wavelength conversion layer(s) is smaller than the number of the LED elements.

Namely, as a result of extensive and intensive studies for solving the above problems, the present inventors have ascertained that a contrivance of limiting the light emitted from an LED by a diffusive reflection resin layer to guide the light more efficiently to an outgoing direction (extraction direction) is important but a contrivance how to guide the light (emitted light) emitted from the wavelength conversion layer (hereinafter sometimes referred to as a "phosphor layer") efficiently to the outgoing direction is more important. For example, in a white LED where a blue LED and a yellow phosphor are combined, most part of the white color component is yellow emission and most of the blue light is converted into yellow color. Namely, they have ascertained that it is very important to adopt a measure most suitable for the emitted light from the phosphor layer, which accounts for most part of the white light. Accordingly, as a result of further continued experiments, the inventors have found that, when the wavelength conversion layer is provided on an upper side of the LED element and also a diffusive reflection resin layer is provided in a state that side faces of the LED element are surrounded therewith as well as the area at the LED element face side (face side opposite to the light extraction face) of the wavelength conversion layer is at least twice larger by area ratio than the area of light emitting area on the upper surface of the LED element, the light from the LED element enters only into the wavelength conversion layer and most of the light emitted from the wavelength conversion layer comes out from a light outgoing surface (light exit surface) of the semiconductor light emitting device, so that the light extraction efficiency of the semiconductor light emitting device is improved. Thus, they have reached the invention. Namely, as shown in FIG. 1 which is a schematic view showing the above theoretical concept, the excitation light A from an LED (not shown in the figure) enters a wavelength conversion layer 1 but the light to be primarily total internal reflection light among the light (emitted light) B emitted from the wavelength conversion layer 1 strikes the surface of the diffusive reflection resin layer 2 to be diffuse-reflected and then becomes a diffuse reflection light F, which propagates to the light extraction direction. Thus, the light which may primarily become the total internal reflection light and may be confined in the wavelength conversion layer 1 is repeatedly diffusion-reflected and finally, most of the light is guided to the light extraction direction. Therefore, the article of the invention is excellent in light extraction efficiency. Incidentally, FIG. 1 shows an example in which the emitted light at a side edge face 1a of the wavelength conversion layer 1 can be also guided to the light extraction direction by raising up an edge of the diffusive reflection resin layer 2 to form a raised-up wall, forming the part of the raised-up wall as a diffusive reflection resin layer 2a, and opposing the inner wall face thereof to the side edge face 1a.

As above, in the semiconductor light emitting device of the invention, the wavelength conversion layer is provided on an upper side of the LED element and a diffusive reflection resin layer is provided in a state that side faces of the LED element are surrounded therewith, and the area at the LED element side of the wavelength conversion layer is at least twice larger by area ratio than the area of light emitting area on the upper surface of the LED element. Therefore, light propagating to a direction other than the extraction direction among the light emitted at the wavelength conversion layer strikes to the diffusive reflection resin layer and is diffusion-reflected to propagate to the extraction direction. Thus, the light propagating to improper directions is repeatedly diffusion-reflected and is course-corrected to the proper direction. Accordingly, most of the light can be finally guided to the light extraction direction. Consequently, since the back scattering light can be reduced and the light extraction efficiency can be remarkably enhanced, the semiconductor light emitting device of the invention shows a high luminance and a high efficiency.

Moreover, when the wavelength conversion layer is a phosphor plate which includes a translucent ceramic including a polycrystalline sintered body whose sintered density is 99.0% or more, having a total light transmittance of 40% or more in a visible light wavelength region excluding an excitation wavelength region, and having a thickness of 100 to 1,000 µm, the phosphor plate itself does not contain a resin having a low thermal conductivity, so that heat generated in the phosphor is efficiently radiated to a printed wiring board side through the phosphor plate and thus heat radiation properties are improved. In conventional semiconductor light emitting devices, attention is mainly focused on only the viewpoint how to radiate heat generated from an LED. In the invention, since such a heat radiation measure as described above is performed not only the heat generated from the LED but also heat generated from the wavelength conversion layer, the heat radiation properties are excellent and the invention is particularly advantageous for a high output type power LED.

Furthermore, unevenness in properties of the wavelength conversion layer, which tends to cause emission color fluctuation between products, can be suppressed to the minimum by using a phosphor plate or phosphor sheet having a controlled thickness as the wavelength conversion layer.

When the diffusive reflection resin layer is formed from a cured material of a resin composition containing a transparent resin and an inorganic filler different in refractive index from the transparent resin, the heat generated from the phosphor is efficiently radiated to the printed wiring board side through the conducting filler added to the transparent resin. Accordingly, since an efficiency decrease of the LED and the phosphor by temperature elevation is suppressed, higher luminance and higher efficiency can be further realized and also durability of the semiconductor light emitting device is improved.

DETAILED DESCRIPTION OF THE INVENTION

The following will describe embodiments of the invention in detail. However, the invention is not limited to the embodiments.

Figures 2A, 2B:
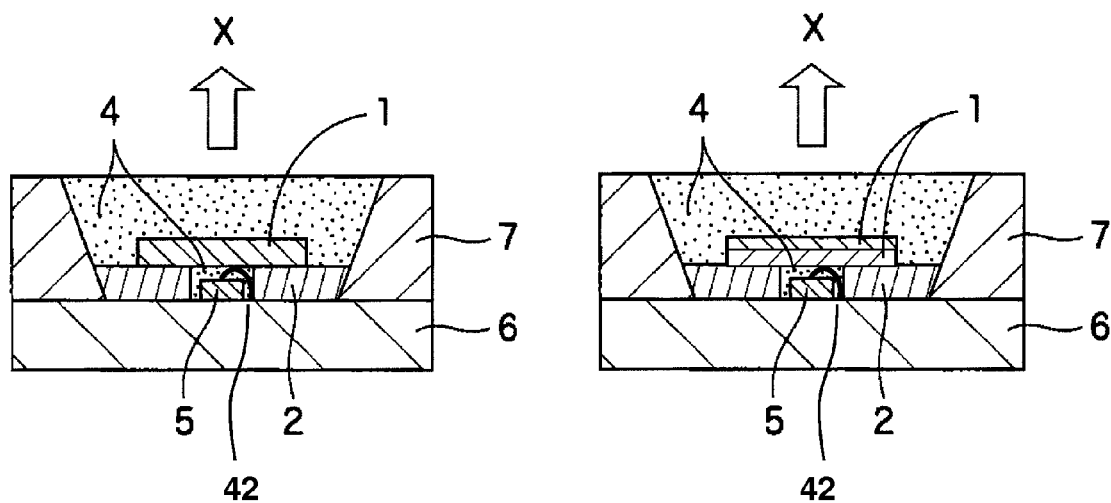
FIG. 2A and FIG. 2B are schematic views showing examples of the semiconductor light emitting device of the invention.

As the semiconductor light emitting device of the invention, for example, as shown in FIG. 2A, there are mentioned a device including a printed wiring board 6 for LED element mounting, an LED element 5 provided on the printed wiring board 6, and a wavelength conversion layer 1 which contains phosphor material and converts the wavelength of light emitted from the LED element 5. In the invention, the wavelength conversion layer is provided on an upper side of the LED element 5 and a diffusive reflection resin layer 2 is provided in a state that side faces of the LED element 5 are surrounded therewith. In the figure, 4 represents an encapsulating resin layer for encapsulating an LED element 5 and 7 represents a reflector. In this regard, a wiring pattern (lead) on the printed wiring board 6, an adhesive (silver paste or the like) for adhering the LED element 5 to the board 6, and a wire (gold wire or the like) for connecting the LED element 5 to the lead are not shown in the figure for simplification.

In the invention, the area at the LED element 5 face side of the wavelength conversion layer 1 is at least twice larger by area ratio than the area of light emitting area on the upper surface of the LED element 5. This is the most characteristic feature of the invention.

Here, the "area of light emitting area on the upper surface of the LED element" refers to the area of light emitting area on the upper surface of the LED element in the case where one piece of the LED element is present, and also means total area of the area of light emitting area on the upper surface of each LED element in the case where plural pieces of the LED element are present. For example, in the type where four pieces of the LED element are mounted, in the case where the size of light emitting area of the upper surface of each LED element is 2 mm×2 mm, the area of light emitting area of the upper surface of each LED element becomes 4 $mm^2$. Therefore, the total area, 16 $mm^2$ (4 $mm^2$×4) is the "area of light emitting area of the upper surface of the LED element".

Figure 1:
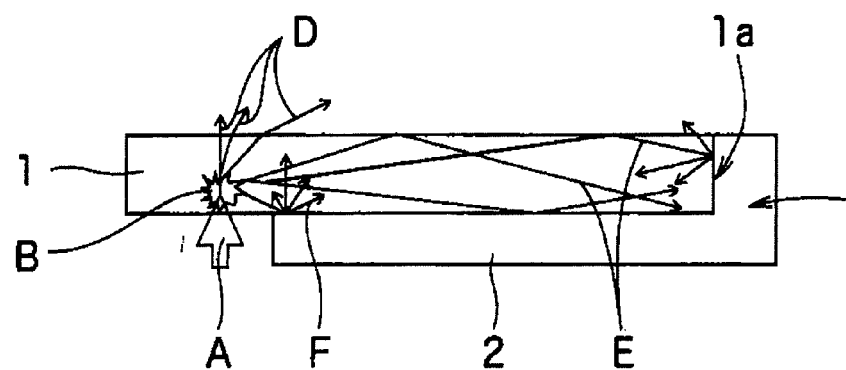
FIG. 1 is a schematic view showing behavior of the light emitted at the wavelength conversion layer in the semiconductor light emitting device of the invention.
Figure 3:
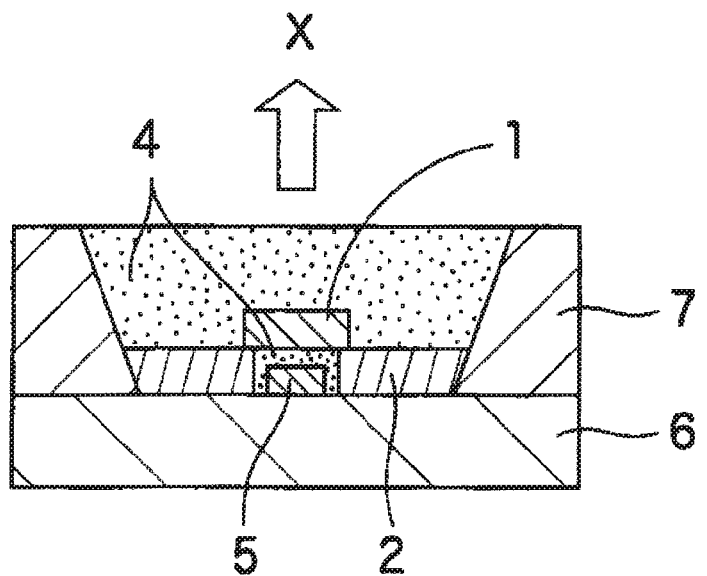
FIG. 3 is a schematic view showing one example of a conventional semiconductor light emitting device.

In the invention, the area at the LED element face side of the wavelength conversion layer is preferably at least twice larger, preferably five times larger, and more preferably twenty times larger by area ratio than the area of light emitting area of the upper surface of the LED element. When the area at the LED element face side of the wavelength conversion layer is too small, an action to generate a large number of diffuse reflection light F by the wavelength conversion layer 1 and the diffusive reflection resin layer 2 to guide the light to the light extraction direction as shown in FIG. 1 decreases. In addition, as show in FIG. 3, there occurs a phenomenon that the light radiated from the wavelength conversion layer 1 enters into the LED element 5 side in large part and hardly enters into the diffusive reflection resin layer 2 side. Namely, although omitted in FIG. 3, wires, leads, adhesives, and the like for electrically connecting the LED element 5 are used in the vicinity of the LED element 5 and a light absorptive metal material and the like are used in the LED element 5 itself, so that the light entering this region is not a little absorbed during the repeated multiple reflection and, as a result, the light cannot be efficiently extracted.

On the other hand, in the invention, since the area at the LED element face side of the wavelength conversion layer is at least twice larger by area ratio than the area of light emitting area on the upper surface of the LED element, the light to be originally total internal reflection light and not to be extracted actually becomes diffuse reflection light by the wavelength conversion layer and the diffusive reflection resin layer and is extracted. Namely, as shown in FIG. 1, light propagating to a direction other than the extraction direction among the light emitted at the wavelength conversion layer 1 strikes to the diffusive reflection resin layer 2 and is diffusion-reflected to propagate to the extraction direction. Thus, the light propagating to improper directions is repeatedly diffusion-reflected and is course-corrected to the proper direction. Accordingly, most of the light can be finally guided to the light extraction direction. Consequently, the back scattering light can be reduced and the light extraction efficiency can be remarkably enhanced.

Figure 4:
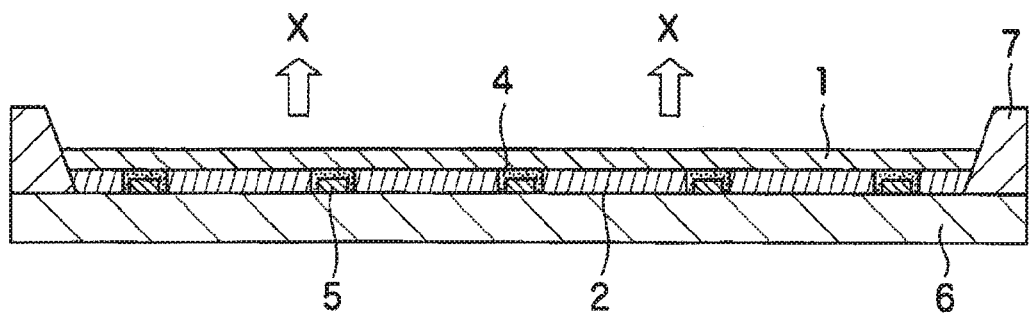
FIG. 4 is a schematic view showing another example of the semiconductor light emitting device of the invention.

The semiconductor light emitting device of the invention is not limited to the surface-mounted package where one piece of the LED element 5 is present as shown in FIGS. 2A and 2B and, for example, as shown in FIG. 4, it may be an array-form light emitting device including a plurality of the LED elements 5. In such an embodiment, since the area (total area) at the LED element 5 face side of the wavelength conversion layer 1 increases, a less expensive flat light emitting element having a large total light flux amount is formed. As the shape of the array-form light emitting device, for example, there are mentioned linear, X-shape, or matrix-shape arrays and the like where the LED elements are one-dimensionally arranged in consideration of uses such as square, rectangular, or edge-form liquid crystal display backlights and the like where the LED elements are two-dimensionally arranged lengthwise and crosswise.

Next, the wavelength conversion layer 1 to be provided at the upper side of the LED element 5 will be described.

<<Wavelength Conversion Layer>>

The wavelength conversion layer 1 contains a phosphor material which absorbs a part or all of excitation light (preferably, a wavelength of 350 to 480 nm) and is excited to thereby emit visible light in a wavelength region (preferably, from 500 to 650 nm) longer than the wavelength of the excitation light.

<Phosphor Material>

Since the semiconductor light emitting device of the invention is usually used in combination with a blue LED having a wavelength of 350 nm to 480 nm or a near-ultraviolet LED, one capable of being excited at least in the range of the above wavelength and emitting visible light is used as the phosphor material. Specific examples of the phosphor material include phosphors having a garnet type crystal structure such as $Y_3Al_5O_{12}$:Ce, $(Y,Gd)_3Al_5O_{12}$:Ce, $Tb_3Al_3O_{12}$:Ce, $Ca_3Sc_2Si_3O_{12}$:Ce, and $Lu_2CaMg_2(Si,Ge)_3O_{12}$:Ce, silicate phosphors such as $(Sr,Ba)_2SiO_4$:Eu, $Ca_3SiO_4Cl_2$:Eu, $Sr_3SiO_5$:Eu, $Li_2SrSiO_4$:Eu, and $Ca_3Si_2O_7$:Eu, oxide phosphors including aluminate phosphors and the like such as $CaAl_{12}O_{19}$:Mn and $SrAl_2O_4$:Eu, sulfide phosphors such as ZnS:Cu,Al, CaS:Eu, $CaGa_2S_4$:Eu, and $SrGa_2S_4$:Eu, oxynitride phosphors such as $CaSi_2O_2N_2$:Eu, $SrSi_2O_2N_2$:Eu, $BaSi_2O_2N_2$:Eu, and Ca-α-SiAlON, nitride phosphors such as $CaAlSiN_3$:Eu and $CaSi_5N_8$:Eu, and the like.

As the phosphor material, for example, when YAG:Ce of yttrium aluminum garnet (YAG) is taken as an example, one obtained by using raw material powders containing constituent elements such as $Y_2O_3$, $Al_2O_3$, and $CeO_3$ and mixing the powders to achieve a solid-phase reaction, Y—Al—O amorphous particles obtained by a wet process such as a co-precipitation method or a sol-gel method, YAG particles obtained by a spray drying method or a vapor-phase method such as a flame pyrolysis method or a thermal plasma method can be employed.

In the invention, a white LED is obtained by combining a blue LED or a near-ultraviolet LED and the above phosphor material but the color tone can be arbitrarily adjusted by the combination of the LED and the phosphor. For example, in order to reproduce a white color close to a light bulb color which is a white color containing much red color component, the color tone can be adjusted by adding a red phosphor to a yellow phosphor. Moreover, the color tone is quite arbitrary and, for example, not a white but a green LED may be obtained by combining a blue LED and a green phosphor, or a pastel color may be reproduced by combining other phosphors.

The wavelength conversion layer 1 is used by forming a binder resin containing phosphor particles dispersed therein into a desired shape and disposing it at a predetermined position. However, particularly, from the viewpoint of suppressing unevenness of emission properties between LED packages to be produced, and further between final products at minimum, the wavelength conversion layer 1 is preferably one capable of easily controlling the thickness and capable of controlling the absorption of the excitation light from the LED and the emission properties of the wavelength conversion layer 1 to a constant level. As preferred embodiments of the wavelength conversion layer 1, there may be mentioned a phosphor plate (embodiment A) obtained by molding the above phosphor material into a desired shape and then sintering it under heating and a phosphor sheet (embodiment B) obtained by applying a solution where the phosphor material is dispersed in a binder resin and molding the solution into a sheet. In this regard, the wavelength conversion layer 1 may be a combination of the phosphor plate (embodiment A) and the phosphor sheet (embodiment B). Specifically, the layer may be one composed of a phosphor plate (embodiment A) prepared beforehand and a phosphor sheet (embodiment B) formed thereon, the sheet being obtained by applying a solution where another phosphor material different in emission properties from the phosphor plate is dispersed in a binder resin and molding the solution into a sheet.

Phosphor Plate

Embodiment A

The phosphor plate is obtained by molding the phosphor material into a desired shape and sintering it under heating and is also referred to as a polycrystalline sintered body because of the production method. As the polycrystalline sintered body, for example, translucent ceramics as described in JP-A-11-147757 and JPA-2001-158660 can be employed. The translucent ceramics have already been in practical use as solid laser materials and highly durable housing materials for high-pressure sodium lamp, metal halide lamp, and the like. The translucency can be enhanced by removing light-scattering sources such as voids and impurities remaining in the ceramics. Moreover, in the isotropic crystal materials represented by YAG, since any difference in refractive index owing to crystal orientation is absent, completely transparent and non-scattering translucent ceramics can be obtained even in the case of polycrystalline ceramics, as in the case of a single crystal. Therefore, the phosphor plate for use in the invention preferably includes a translucent ceramic from the viewpoint of suppressing the loss of the excitation light from the LED or the emitted light from the phosphor owing to the back scattering by light scattering.

The phosphor plate can be, for example, produced as follows. Namely, additives such as a binder resin, a dispersant, and a sintering aid are first added to desired phosphor particles or raw material particles which is a raw material of the phosphor material (hereinafter, both are sometimes collectively referred to as "phosphor material particles") and the whole is wet-mixed in the presence of a solvent by a dispersing apparatus such as any of various mixers, a ball mill, or a beads mill to obtain a slurry solution. In this regard, the additives such as a binder resin, a dispersant, and a sintering aid are preferably those capable of being decomposed and removed by the heat-sintering step to be mentioned later.

Next, after the viscosity of the resulting slurry solution is adjusted according to needs, the solution is molded into a ceramic green sheet by tape casting with a doctor blade, extrusion molding, or the like. Alternatively, after the slurry solution is subjected to spray drying or the like to prepare dry particles containing the binder resin, the particles can be molded into a disk shape by a pressing method using a mold. Thereafter, in order to thermally decompose and remove organic components such as the binder resin and the dispersant from the molded body (the ceramic green sheet or the disk-shape molded body), the body is subjected to a binder-removing treatment in the air at 400 to 800° C. using an electric furnace and then to main sintering, thereby obtaining a phosphor plate. In the case where the disk-shape molded body is obtained, the phosphor plate may be obtained by cutting the body into a plate having an appropriate size and thickness after the main sintering.

As the phosphor material particles for use in the phosphor plate, those having an average particle diameter of 50 nm or more are preferred since the amount of the binder resin for imparting formability varies depending on the specific surface area of the phosphor material particles. When the average particle diameter is 50 nm or more, it is not difficult to increase the ratio of solid components in the molded body without impairing fluidity of the slurry solution by the increase in the specific surface area and without requiring the increase in the amounts of the binder resin, the dispersant, and the solvent necessary for maintaining the shape after molding. As a result, it becomes possible to increase density after sintering, dimensional change during the sintering process is small, and warp of the phosphor plate is suppressed. Also, sintering ability of ceramics decreases as fluidity of the phosphor particles or raw material particles decreases. However, as the density increases, not only sintering at high temperature for obtaining a dense sintered body becomes not necessary but also the occurrence of voids after sintering is more easily reduced. Accordingly, from the viewpoint of the sintering ability, the average particle diameter of the phosphor material particles is preferably 10 μm or less, more preferably 1.0 μm or less, and further preferably 0.5 μm or less.

Incidentally, the average particle diameter of the phosphor particles can be measured, for example, by BET (Brunauer-Emmett-Teller) method which is known as a specific surface area measurement method, a laser diffraction method, direct observation by an electron microscope, or the like.

In the case where the phosphor material particles contain volume change associated with change in crystal structure at sintering or volatile components such as remaining organic substances, from the viewpoint of obtaining a dense sintered body, according to the necessity, those subjected to phase transition into a desired crystal phase by performing temporary sintering beforehand or those having enhanced density and purity may be employed. Moreover, when the phosphor material particles contain coarse particles having a size remarkably larger than the average particle diameter even in a minute amount, the coarse particles become a starting point and a generating source of voids, so that the presence of the coarse particles may be observed by an electron microscope and, according to the necessity, the coarse particles may be removed by suitably performing a classification treatment or the like.

The temperature, time, and sintering atmosphere of the main sintering at the production of the phosphor plate vary depending on the phosphor material to be used. For example, in the case of YAG:Ce, it is sufficient to perform the main sintering at 1,500 to 1,800° C. for 0.5 to 24 hours under vacuum, in an atmosphere of an inert gas such as Ar, or in a reducing gas such as hydrogen or a hydrogen/nitrogen mixed gas. Also, in the case where the main sintering is performed in a reducing atmosphere, in addition to the use of a reducing gas such as hydrogen gas, a method of introducing carbon particles into an electric furnace to enhance reducing ability or a similar method may be applied. Incidentally, in the case of obtaining a dense and highly translucent sintered body, it is possible to perform sintering under pressure by a hot isotropic pressurization sintering method (HIP method).

Moreover, the temperature elevation rate in the main sintering is preferably from 0.5 to 20° C./minute. When the temperature elevation rate is 0.5° C./minute or more, sintering does not take an extremely long time, so that the case is preferred in view of productivity. Also, when the temperature elevation rate is 20° C./minute or less, the growth of crystal grains does not rapidly occur and thus void generation owing to grain growth before the voids and the like are filled does not occur, so that the case is preferred.

Based on the properties that ceramic materials have high hardness but are brittle and easy to be cracked, the production and handling of the phosphor plate become difficult, so that the thickness of the phosphor plate is preferably 100 μm or more. Moreover, from the viewpoint of easy post-processing such as dicing and economical viewpoint, the thickness is preferably 1,000 μm or less. Thus, the thickness of the phosphor plate is preferably in the range of 100 to 1,000 μm.

The sintered density of the phosphor plate is preferably 99.0% or more, more preferably 99.90% or more and further preferably 99.99% or more of the theoretical density from the viewpoint of reducing the light scattering sources in the sintered body. In this regard, the theoretical density is a density calculated from the density of each constituting component, and the sintered density is a density measured by Archimedes method or the like and can be accurately measured even when the sample is a small piece one. For example, in a plate having a sintered density of 99.0% of the theoretical density or more, voids account for remaining less than 1.0% but light scattering is suppressed since scattering centers (light scattering source) are little. Moreover, in general, since the difference between the refractive index of the air (about 1.0) and the refractive index of the sintered body is large, light scattering becomes large when the voids are pores. However, within the above density range, a phosphor plate exhibiting a sufficiently suppressed light scattering can be obtained even when the voids are pores.

Furthermore, in order to reduce light scattering loss, the phosphor plate preferably has translucency. The translucency varies depending on the light scattering centers such as voids and impurities present in the phosphor plate, crystal anisotropy of the constituting phosphor materials, the thickness of the phosphor plate itself, and the like.

The total light transmittance of the phosphor plate is preferably 40% or more, more preferably 60% or more, and further preferably 80% or more. In the invention, in the case where the total light transmittance of the phosphor plate is as low as less than 40%, the emitted light propagating backward is efficiently guided to the light extraction direction by the diffusive reflection layer 2, so that a particularly big problem does not occur with regard to the light emitted from the phosphor. However, with regard to the excitation light from the LED, when the total light transmittance is too low, that is, the diffusivity is strong, there is a concern that the excitation light is back scattered in the part where the diffusive reflection layer 2 is not formed, so that it is preferred to have 40% or more of the total light transmittance from this viewpoint.

Figure 5:
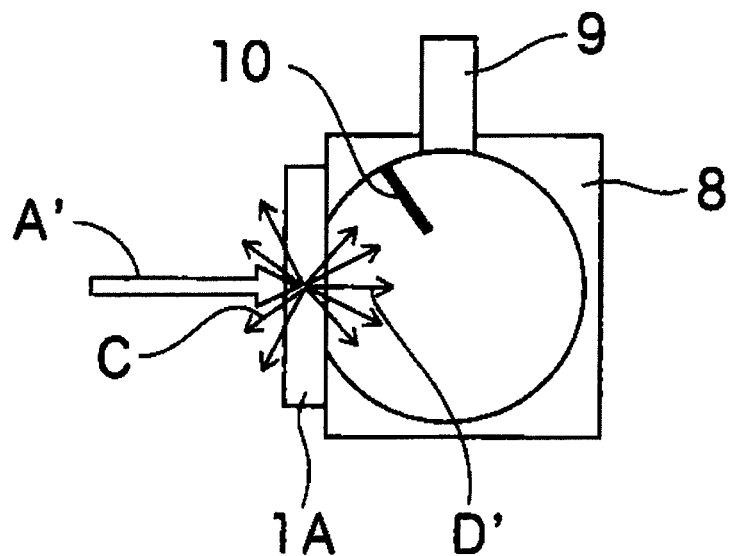
FIG. 5 is an explanatory drawing showing a measurement method of total light transmittance using an integrating sphere.

The total light transmittance is a measure which shows translucency, and can be expressed as diffuse transmittance. The total light transmittance is determined by measuring transmittance of the light (transmitted light) D' passing through the phosphor plate 1A using an integrating sphere 8 as shown in FIG. 5. In the figure, 9 represents a detector, 10 represents a shielding plate, A' represents incident light, and C represents back scattering light. However, since the phosphor material has light absorption at a specific wavelength, light transmittance is measured at a visible light region (e.g., 550 to 800 nm in the case of YAG:Ce) except for the excitation wavelength, i.e., the region where the phosphor material does not show absorption.

In the case where the semiconductor light emitting device of the invention is a device which emits white light obtained by mixing the emission (blue emission) from a blue LED and the emission (yellow emission) by a yellow phosphor such as YAG:Ce, the color tone of the white light can be controlled by the ratio of the blue emission absorbed by the wavelength conversion layer 1. Specifically, for example, in the case where the excitation light absorbance of the phosphor material is constant, the blue emission passing through the wavelength conversion layer 1 increases as the thickness of the wavelength conversion layer 1 decreases and strongly bluish white light is obtained. Contrarily, the blue emission passing through the wavelength conversion layer 1 decreases as the thickness of the wavelength conversion layer 1 increases and strongly yellowish white light is obtained. Therefore, in the case of adjusting the color tone, it is sufficient to adjust the thickness of the phosphor plate within the range of 100 to 1,000 μm mentioned above.

Incidentally, the excitation light absorbance of the phosphor material can be usually adjusted by the doping amount of a rare-earth element to be added as an activator to the phosphor material. The relation between the activator and the absorbance varies depending on the kind of constituent elements of the phosphor material, the heat treatment temperature at the sintered body producing step, and the like. For example, in the case of YAG:Ce, the amount of Ce to be added is preferably from 0.01 to 2.0% by atom per yttrium atom to be replaced. Therefore, emitted light having a desired color tone is obtained by adjusting the thickness of the phosphor plate and the excitation light absorbance of the phosphor material.

In the case where an isotropic crystal material is used as the phosphor material and a sintered material from which voids and impurities are completely removed is obtained, the resulting phosphor plate is completely transparent one with substantially no light scattering. The total light transmittance in this case becomes maximum transmittance (theoretical transmittance) except for transmittance decrease by Fresnel reflection at both surfaces of the plate. For example, in the case of YAG:Ce phosphor having a refractive index of 1.83 ($n_1$), the reflection at the surface is as shown by the following mathematical expression (1) when the refractive index of the air is 1 and vertical incidence is supposed.

$$\text{about } 8.6\% \left( \text{Reflection coefficient} = \left[ \frac{n_1 - 1}{n_1 + 1} \right]^2 \approx 0.086 \right) \quad (1)$$

Accordingly, the transmittance coefficient (Ta) at YAG:Ce surface is 0.914. Actually, since reflection loss occurs at the both surfaces of the plate, the theoretical transmittance (T) is as shown by the following mathematical expression (2).

$$\text{about } 84.2\% \left( T = \left[ \frac{Ta}{2 - Ta} \right] \approx 0.842 \right) \quad (2)$$

However, when the phosphor becomes such a completely transparent body, there is a concern that a light confinement effect owing to total internal reflection caused by the difference in refractive index between the phosphor plate and an outer region thereof (e.g., adhesive layer) becomes a problem. In the invention, the light extraction efficiency can be enhanced by the diffusive reflection resin layer 2. Nevertheless, it is not easy to completely extract the confined light and the light with a critical angle or more is trapped in the phosphor plate, the critical angle being determined by the difference in refractive index between the phosphor plate and the outer region, so that there is a concern that emission efficiency of an LED decreases.

Figure 6:
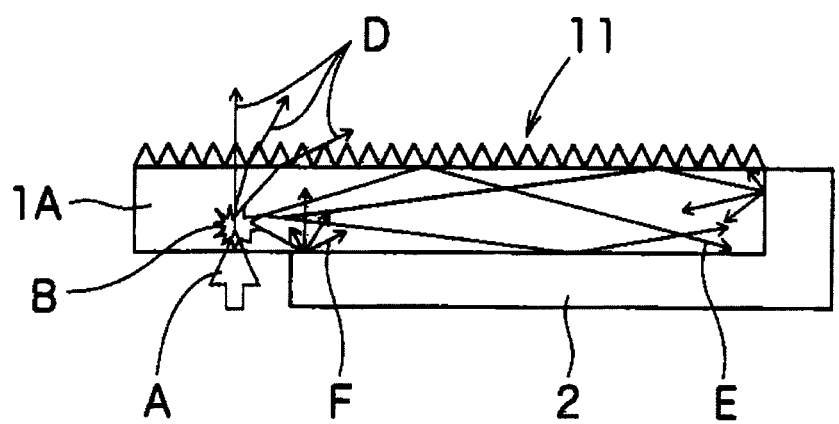
FIG. 6 is a schematic view showing behavior of the light emitted at the wavelength conversion layer in the semiconductor light emitting device of the invention on which an optical member is disposed.

In the invention, in order to avoid such a decrease in emission efficiency of an LED, for example, as shown in FIG. 6, there may be performed an optical design that an uneven member 11 is disposed as an optical member on the surface at the light extraction side of the phosphor plate 1A to suppress total internal reflection at the phosphor plate 1A interface. Usually, even when light E confined in the phosphor plate 1A by total internal reflection reaches the uneven member 11 formed on the surface, it is difficult to extract the whole at once. However, when an optical member such as the uneven member 11 is formed, the confined light E not extracted at once returns to the inside again and is diffused and reflected by the diffusive reflection resin layer 2, thereby reaching to the surface having the uneven member 11 many times with changing the transmission angle. Therefore, most of the confined light is finally extracted to the light extraction direction and thus an effect of improving the light extraction efficiency is obtained. Thus, light scattering loss, particularly back scattering loss of the excitation light from the LED and the confined light by total internal reflection reach substantially zero, so that the light emission efficiency can be remarkably enhanced. In this regard, a similar effect can be obtained by disposing an optical member such as microlens instead of the uneven member 11 in FIG. 6.

As materials for the optical members such as the uneven member 11 and the microlens, examples include polycarbonate resins, acrylic resins, epoxy resins, silicone resins, and the like.

Moreover, the light confinement by total internal reflection can be reduced by controlling the diffusivity of the inside of the phosphor plate. Namely, to the phosphor plate having a sufficiently reduced back scattering loss and a high total light transmittance, diffusivity is imparted while maintaining the above properties. As a specific method, for example, the diffusivity can be imparted by lowering the sintering properties of the ceramic, i.e., the sintered density to introduce voids intentionally. However, the void that is a pore has a refractive index as low as about 1.0 and thus the difference in refractive index with the phosphor material is large, so that it is difficult to impart the diffusivity while maintaining high total light transmittance by controlling the density, size, and distribution of the voids. Accordingly, as an alternative method, there may be mentioned a method of controlling the diffusivity by a second phase different from the phosphor material. Specifically, for example, in the case of a YAG:Ce phosphor, a phosphor plate in which YAG:Ce crystal grains and alumina crystal grains are mixed can be formed by controlling the composition ratio of (total of yttrium and cerium)/(aluminum) of the raw materials to aluminum-rich one intentionally. Since YAG:Ce and alumina are different in refractive index, light scattering occurs but back scattering loss can be reduced since the difference in refractive index is not so large as in the case of the voids. Thus, by controlling the material composition ratio to be used at the adjustment of the phosphor plate and the sintering conditions, the diffusivity of the inside of the phosphor plate can be also controlled.

The phosphor plate may be used with laminating a plurality of the phosphor plates according to needs, for example, as shown in FIG. 2B. For example, in the case of using a near-ultraviolet LED, phosphor plates each composed of a blue, green, or red phosphor material are prepared and these plates can be combined by lamination. Moreover, in the case of using a blue LED, color rendering properties of the LED can be enhanced by the combination of yellow and red phosphor plates or the combination of green and red phosphor plates.

Moreover, it is also possible to suppress the amount of expensive phosphor materials to be used by laminating a colorless transparent layer including a non-fluorescence-emitting transparent material such as YAG to which an activator Ce is not added, alumina, or yttria on the phosphor plate to thereby reduce the thickness of the phosphor plate itself. As the lamination method, for example, after a ceramic green sheet including a phosphor material and a ceramic green sheet including a non-fluorescence-emitting transparent material (YAG to which Ce is not added, or the like) are laminated by a hot press or the like, they can be subjected to sintering or the like at once. The thickness of the phosphor plate on which the colorless transparent layer is laminated is preferably from 100 to 1,000 μm and more preferably from 250 to 750 μm.

Next, the phosphor sheet that is another embodiment (embodiment B) of the wavelength conversion layer 1 will be described.

Phosphor Sheet

Embodiment B

The phosphor sheet is obtained by applying a solution containing the phosphor material dispersed in a binder resin and molding the solution into a sheet. Specifically, a binder resin containing the phosphor material dispersed therein or an organic solvent solution of the resin is applied on a separator (e.g., surface release-treated PET film) in an appropriate thickness by a method such as casting, spin coating, or roll coating and a film forming step of drying at such a temperature that removal of the solvent is possible is carried out, thereby molding a sheet. The temperature for drying the filmed resin or resin solution cannot be categorically determined since the temperature varies depending on the kinds of the resin and the solvent but is preferably from 80 to 150° C., more preferably from 90 to 150° C.

As the phosphor particles for use in the phosphor sheet, from the viewpoint of the emission efficiency, one having an average particle diameter of 100 nm or more is preferred. Namely, when the average particle diameter of the phosphor particles is less than 100 nm, the influence of surface defect of the phosphor particles increases and a tendency to decrease the emission efficiency is observed. Moreover, from the viewpoint of the film formability, the phosphor particles preferably have an average particle diameter of 50 μm or less.

The binder resin for dispersing the phosphor material is preferably one showing a liquid state at room temperature, dispersing the phosphor material, and subsequently being cured. For example, there may be mentioned silicone resins, epoxy resins, acrylic resins, urethane resins, and the like. They are used singly or two or more thereof are used in combination. Among them, from the viewpoints of heat resistance and light resistance, a condensation-curable silicone resin, an addition-curable silicone resin, and the like are suitably used. Of these, an addition type thermosetting silicone resin containing dimethylsilicone as a main component is preferred.

The content of the phosphor material is adjusted in view of the thickness of the sheet and the objective color. For example, in the case where the thickness of the sheet is 100 μm and white light is emitted by using a yellow phosphor as a phosphor material and mixing the color with the color of a blue LED, the content is preferably from 5 to 80% by weight and more preferably from 10 to 30% by weight in the sheet.

From the viewpoints of the film formability and package appearance, the thickness of the phosphor sheet is preferably from 50 to 200 μm and more preferably 70 to 200 μm. In this regard, a plurality of the resulting sheets may be formed into one sheet having a thickness within the above range by laminating and heat-pressing the sheets or attaching them each other via a transparent adhesive or pressure-sensitive adhesive. In the case where a plurality of the sheets are laminated, for example, a structure having a yellow emission layer and a red emission layer in one sheet may be formed by laminating different sheets containing different kinds of phosphors such as a yellow phosphor and a red phosphor.

As described previously, the total thickness of the wavelength conversion layer 1 formed by laminating the phosphor sheet (embodiment B) on the phosphor plate (embodiment A) is preferably from 50 to 2,000 μm and more preferably from 70 to 500 μm. As far as it has a thickness within the above range, a plurality of the phosphor sheets may be laminated on the phosphor plate formed by laminating a plurality of the plates. The combination of the phosphor materials used, lamination sequence, thickness of each layer, and the like can be quite arbitrarily designed.

The total light transmittance of the phosphor sheet is preferably 40% or more, 60% or more, and further preferably 80% or more, as in the case of the phosphor plate mentioned previously. However, in the case of the phosphor sheet, since the phosphor particles having different refractive indices each other are dispersed in a binder resin, scattering occurs to no small extent. Accordingly, it is preferred to use a phosphor having a high absorbance so that white color is obtained even when the amount of the phosphor particles to be added is decreased. Namely, when a phosphor having a low absorbance is used, in order to obtain white color, it is necessary to add the phosphor particles in higher concentration. As a result, scattering centers increase, so that there is a concern that the total light transmittance decreases. Incidentally, the total light transmittance of the phosphor sheet can be measured in accordance with the aforementioned measurement method of the total light transmittance of the phosphor plate.

Next, the diffusive reflection resin layer 2 to be provided in a state where side faces of the LED element 5 are surrounded therewith will be described.

<<Diffusive Reflection Resin Layer>>

Figure 7:
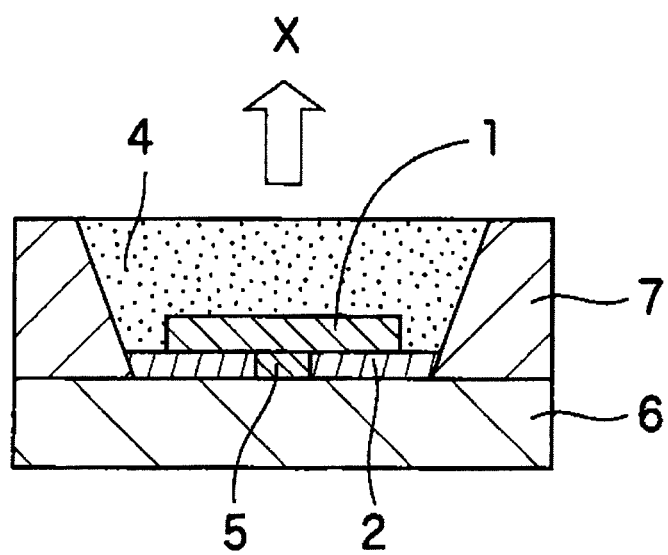
FIG. 7 is a schematic view showing the other example of the semiconductor light emitting device of the invention.

In the above FIG. 2A, an encapsulating resin is filled into a gap between the diffusive reflection resin layer 2 and the LED element 5 and a gap between the LED element 5 and the wavelength conversion layer 1 to form an encapsulating resin layer 4. In the invention, for example, as shown in FIG. 7, the gap between the diffusive reflection resin layer 2 and the LED element 5 and the gap between the LED element 5 and the wavelength conversion layer 1 may be removed to bring the LED element 5 into direct contact with the diffusive reflection resin layer 2 and the wavelength conversion layer 1. In the case of such an embodiment, the heat generated from the LED element 5 and the wavelength conversion layer 1 is prone to be transmitted to the diffusive reflection resin layer 2 and is easily radiated via the diffusive reflection resin layer 2, so that heat radiation properties are improved.

Figure 8:
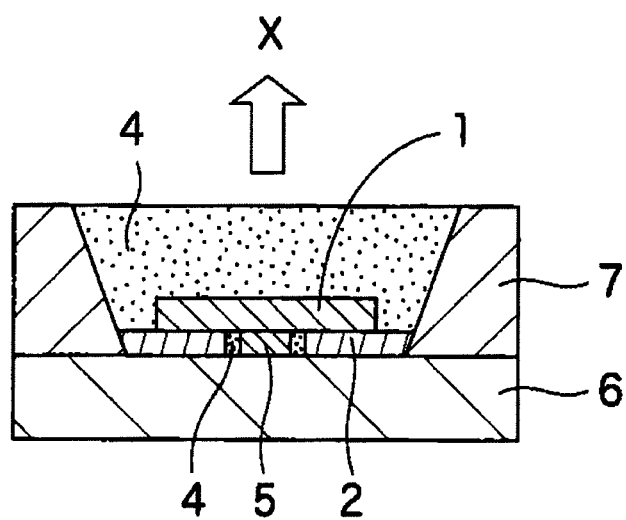
FIG. 8 is a schematic view showing the other example of the semiconductor light emitting device of the invention.

As shown in FIG. 8, there may be a configuration that the gap between the LED element 5 and the wavelength conversion layer 1 is removed to bring the LED element 5 into direct contact with the wavelength conversion layer 1 and the encapsulating resin layer 4 is formed in the gap between the diffusive reflection resin layer 2 and the LED element 5.

Figure 9:
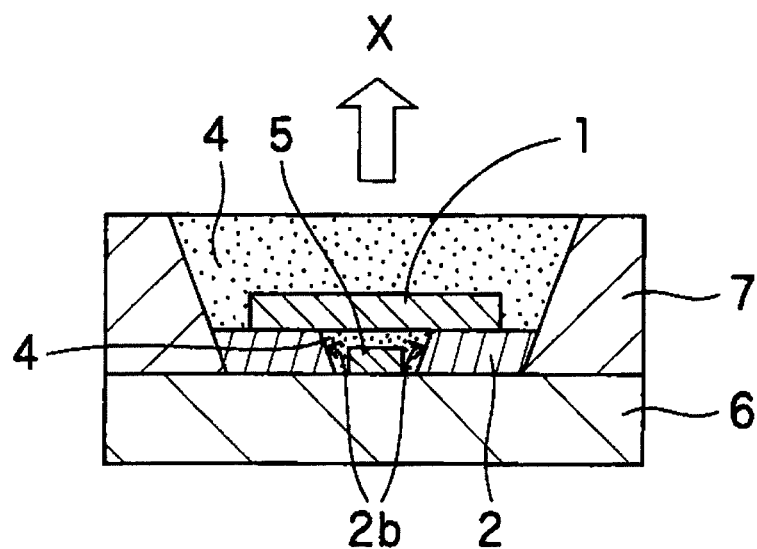
FIG. 9 is a schematic view showing the other example of the semiconductor light emitting device of the invention.
Figure 10:
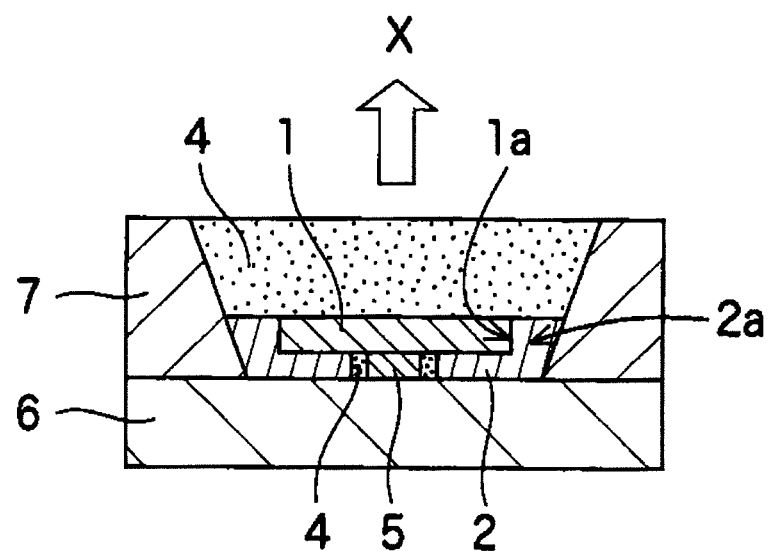
FIG. 10 is a schematic view showing the other example of the semiconductor light emitting device of the invention.
Figure 11:
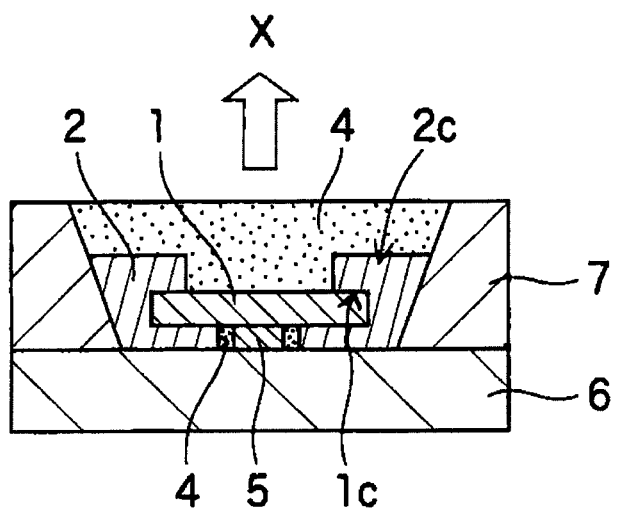
FIG. 11 is a schematic view showing the other example of the semiconductor light emitting device of the invention.

Moreover, as shown in FIG. 9, a side edge face 2b of the diffusive reflection resin layer 2 may be tapered or, as shown in FIG. 10, a diffusive reflection resin 2a may be formed on a side edge face 1a of the wavelength conversion layer 1. In the embodiment of FIG. 10, since the emitted light at the side edge face 1a of the wavelength conversion layer 1 can be also guided to the light extraction direction X as shown in the above FIG. 2A, the light emission efficiency is further improved. Furthermore, a wavelength conversion layer 2c may be formed at the side edge face 1a of the wavelength conversion layer 1 and also so that the layer 2c wraps around the edge part 1c of the light extraction face of the wavelength conversion layer 1, as shown in FIG. 11. In the case of the embodiment of FIG. 11, the light emission region can be controlled.

Figure 12:
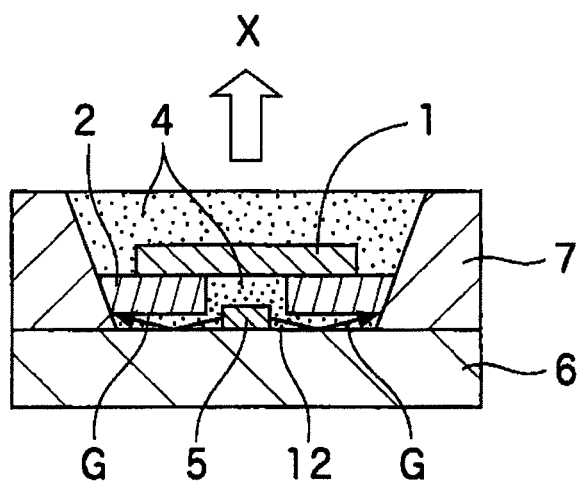
FIG. 12 is a schematic view showing the other example of the semiconductor light emitting device of the invention.

In addition, for example, as shown in FIG. 12, a slight gap 12 may be provided at the interface between the printed wiring board 6 and the diffusive reflection resin layer 2. In order to prevent the light emitted from the LED element 5, particularly the light G transmitting in a direction parallel to the printed wiring board 6 from hiding under the back side of the diffusive reflection resin layer 2, primarily, the printed wiring board 6 and the diffusive reflection resin layer 2 are preferably adjacent to each other as far as possible. However, in the case where the gap 12 at the interface between the printed wiring board 6 and the diffusive reflection resin layer 2 is sufficiently thin as in the case of an adhesive layer or a transparent protective film formed on the board surface, an influence of decrease in light quantity owing to the hiding effect is little, so that a slight gap is allowable. Similarly, a slight gap may be provided at the interface between the diffusive reflection resin layer 2 and the wavelength conversion layer 1. The above gap 12 is usually 500 μm or less, preferably 300 μm or less, and further preferably 100 μm or less. Incidentally, in the above gaps, an encapsulating resin layer may be formed by filling an encapsulating resin according to needs.

Next, the resin composition for forming the diffusive reflection resin layer will be described.

In the invention, the diffusive reflection resin layer 2 refers to a layer having white color diffuse reflectivity with substantially no light absorption. The diffusive reflection resin layer 2 is, for example, formed from a cured material of a resin composition containing a transparent resin and an inorganic filler different in refractive index from the transparent resin.

<Transparent Resin>

Examples of the transparent resin include silicone resins, epoxy resins, acrylic resins, and urethene resins. They are used singly or two or more thereof are used in combination. Among them, from the viewpoints of heat resistance and light resistance, silicone resins are preferred.

The refractive index of the transparent resin is preferably in the range of 1.40 to 1.65 and more preferably in the range of 1.40 to 1.60. The refractive index can be measured using an Abbe refractometer.

<Inorganic Filler>

The inorganic filler is preferably white and insulating one having no absorption in a visible light region. Moreover, from the viewpoint of enhancing diffuse reflectance, one having a large difference in refractive index from the transparent resin is preferred. Furthermore, in view of efficiently radiating heat generated from the LED and the wavelength conversion layer 1, a material having a high thermal conductivity is more suitable. Specifically, the inorganic filler includes alumina, aluminum nitride, titanium oxide, barium titanate, potassium titanate, barium sulfate, barium carbonate, zinc oxide, magnesium oxide, boron nitride, silica, silicon nitride, gallium oxide, gallium nitride, zirconium oxide, and the like. They are used singly or two or more thereof are used in combination.

With regard to the refractive index of the inorganic filler, one having a large difference in refractive index from the transparent resin is preferred. Specifically, the difference in refractive index is preferably 0.05 or more, particularly preferably 0.10 or more, and most preferably 0.20 or more. Namely, when the difference between the refractive index of the inorganic filler and the refractive index of the transparent resin is small, a sufficient light reflection and scattering do not occur at the interface, so that the diffuse reflectance obtained as a result of multi-reflection and scattering of light by the added inorganic filler decreases and a desired light extraction effect is not obtained. Incidentally, the refractive index can be measured as in the case of the transparent resin.

The shape of the inorganic filler includes spherical one, needle-like one, plate-like one, hollow particles, and the like. The average particle diameter is preferably in the range of 100 nm to 10 μm.

The amount of the inorganic filler to be added is preferably in the range of 10 to 85% by volume, more preferably in the range of 20 to 70% by volume, and further preferably in the range of 30 to 60% by volume based on the transparent resin. Namely, when the amount of the inorganic filler to be added is too small, it is difficult to obtain a high reflectivity and the diffusive reflection resin layer 2 for obtaining a sufficient diffuse reflectance becomes thick, so that it becomes difficult to obtain a sufficient reflectance toward the light from the LED or the wavelength conversion layer 1. Contrarily, when the amount of the inorganic filler to be added is too large, there is observed a tendency that processability and mechanical strength at the formation of the diffusive reflection resin layer 2 decrease.

The thickness of the diffusive reflection resin layer 2 is preferably from 50 to 2,000 μm from the viewpoint of having a sufficient diffuse reflectance toward the light from the wavelength conversion layer 1.

Moreover, the diffuse reflectance of the diffusive reflection resin layer 2 is preferably 80% or more, more preferably 90% or more, and further preferably 95% or more at a wavelength of 430 nm. Incidentally, the diffuse reflectance can be evaluated by forming a transparent resin containing the inorganic filler added thereto on a glass substrate in a desired thickness to prepare a sample and measuring the diffuse reflectance of the sample.

<<Encapsulating Resin Layer>>

In FIG. 1, the region surrounded by the LED element 5, the diffusive reflection resin layer 2 and the wavelength conversion layer 1 is encapsulated with an encapsulating resin to form an encapsulating resin layer 4. Since the part is irradiated with the emitted light from the LED element 5 at a high density and is near to the LED element 5 and thus the influence of heat is large, it is preferred to use a resin having high heat resistance and light resistance as the encapsulating resin for forming the encapsulating resin layer 4, and a silicone resin is suitably used. Moreover, as the encapsulating resin for use in the encapsulating resin layer 4 at the side surrounded by the wavelength conversion layer 1 and the reflector 7, a silicone resin-based material as above, an epoxy resin, and the like may be mentioned. The encapsulating resin layer 4 is not necessarily formed and there may be a structure that the wavelength conversion layer 1 and the diffusive reflection resin layer 2 are exposed without forming the encapsulating resin layer 4 in the region surrounded by the LED element 5, the diffusive reflection resin layer 2, and the wavelength conversion layer 1 and in the region surrounded by the wavelength conversion layer 1 and the reflector 7.

<<Printed Wiring Board>>

Examples of the printed wiring board 6 include resin-made ones, ceramic-made ones, and the like. Particularly, a surface-mounted board is suitably used.

<<Reflector>>

As a reflector 7, for example, a resin-made one to which a filler is added or a ceramic-made one as disclosed in JP-A-2007-297601 is used. For efficiently guiding a resulting emitted light to the extraction direction, the reflector is preferably formed of a material having a high light reflectance.

<<Optical Member>>

In the invention, for the purpose of the light extraction efficiency from a semiconductor light emitting element, directivity control, and diffusivity control, an optical member such as a dome-shape lens, a microlens array sheet, or a diffuse sheet may be formed on the light extraction face.

Examples of the material for the optical member such as the semi-spherical lens, the mirolens array sheet, or the diffuse sheet include polycarbonate resins, acrylic resins, epoxy resins and silicone resins.

Next, the process for producing the semiconductor light emitting device of the invention will be described.

Namely, a phosphor plate or a phosphor sheet to be the wavelength conversion layer is first prepared according to the aforementioned method. Also, an inorganic filler is dispersed into a transparent resin to prepare a resin composition (resin solution) for diffusive reflection resin layer formation. Furthermore, a substrate with a reflector on which an LED element is mounted is arranged. Then, the resin composition (resin solution) for diffusive reflection resin layer formation is filled in a state that the side faces of the LED element are surrounded, and is heated at 100° C. for 1 hour and at 150° C. for 1 hour to cure the resin composition (resin solution). Then, the phosphor plate or phosphor sheet is placed on the diffusive reflection resin layer with care so that no air bubbles remain and is cured under the same conditions to fix the phosphor plate or phosphor sheet. Thereafter, an encapsulating resin is filled into the region surrounded by the reflector and the phosphor plate or the like and is cured under the same conditions. Thus, an objective semiconductor light emitting device can be prepared.

In this regard, an adhesive layer or a pressure-sensitive adhesive layer may be formed on one surface of the phosphor plate or phosphor sheet beforehand, and the phosphor plate or phosphor sheet may be attached to the diffusive reflection resin layer via the layer. In this case, since high heat resistance and light resistance are required for the adhesive layer or pressure-sensitive adhesive layer, it is preferred to use a silicone resin-based material.

EXAMPLES

The following will describe Examples together with Comparative Examples. However, the invention is not limited to these Examples.

First, the following materials were prepared prior to Examples and Comparative Examples.

<<Synthesis of Inorganic Phosphor (YAG:Ce)>>

In 250 ml of distilled water were dissolved 0.14985 mol (14.349 g) of yttrium nitrate hexahydrate, 0.25 mol (23.45 g) of aluminum nitrate nonahydrate, and 0.00015 mol (0.016 g) of cerium nitrate hexahydrate, thereby preparing a 0.4M precursor solution. The precursor solution was sprayed into RF-induced plasma flame at a rate of 10 ml/min and thermally decomposed, thereby obtaining inorganic powder particles (raw material particles). As a result of analyzing the resulting raw material particles by X-ray diffractometry, a mixed phase of an amorphous phase and YAP (YAlO$_3$) crystals was observed. Moreover, as a result of measuring an average particle diameter of the inorganic powder particles (raw material particles) according to the criteria shown below, the average particle diameter determined by BET (specific surface area measurement) method was about 75 nm.

Then, the obtained raw material particles were placed in an aluminum-made crucible and temporarily sintered at 1200° C. for 2 hours to obtain a YAG:Ce phosphor. The resulting YAG:Ce phosphor showed that the crystal phase was a single phase of YAG. Moreover, as a result of measuring an average particle diameter of the YAG:Ce phosphor according to the criteria shown below, the average particle diameter determined by BET method was about 95 nm.

(Average Particle Diameter of Raw Material Particles, Phosphor Particles)

The average particle diameter of raw material particles, phosphor particles having a size of less than 1 μm was calculated by BET (Brunauer-Emmett-Teller) method using an automatic specific surface area measurement apparatus (Model Gemini 2365 manufactured by Micrometrics Inc.). About 300 mg of the particles were collected into a test tube cell attached to the above measurement apparatus and subjected to a heating treatment at 300° C. for 1 hour by a dedicated pre-treatment heating apparatus to remove water content completely, and then particle weight after the drying treatment was measured. Based on the particle weight, the average particle diameter was calculated from the adsorption specific surface area value (g/m$^2$) obtained from the specific surface area measurement and density (g/cm$^3$) of the material using a theoretical relational expression [particle diameter=6/(adsorption specific surface area value×density)].

As for commercially available phosphor particles having a size of 1 μm or more, such as phosphor particles for use in a YAG sheet to be mentioned later, after approximate size confirmation was performed by direct observation on a scanning electron microscope (SEM), basically, the catalog values of the manufacturers from which the phosphors had been purchased were adopted as the average particle diameters without change.

<<Preparation of Phosphor Plate (YAG Plate)>>

In a mortar, 4 g of a YAG:Ce phosphor (average particle diameter: 95 nm) prepared beforehand, 0.21 g of poly(vinyl butyl-co-vinyl alcohol co vinyl alcohol) (manufactured by Sigma-Aldrich Corporation, weight-average molecular weight: 90,000 to 120,000) as a binder resin, 0.012 g of silica powder (trade name "CAB-O-SIL HS-5" manufactured by Cabot Corporation) as a sintering aid, and 10 ml of methanol were mixed to form a slurry. Methanol in the resulting slurry was removed by a drier, thereby obtaining a dried powder. After 700 mg of the dried powder was filled into a monoaxial press mold having a size of 25 mm×25 mm, the powder was pressed under about 10 tons by a hydraulic press machine to obtain a plate-shape green body which was molded into a rectangle having a thickness of about 350 μm. The resulting green body was heated in the air at a temperature elevation rate of 2° C./min until 800° C. in a tubular electric furnace to decompose and remove organic components such as the binder resin. Thereafter, the inside of the electric furnace was subsequently evacuated by a rotary pump and heating was performed at 1,600° C. for 5 hours, thereby obtaining a YAG:Ce phosphor ceramic plate (YAG plate) having a thickness of about 280 μm and a size of about 20 mm×20 mm.

As a result of measuring sintered density of the resulting phosphor plate according to the following criteria, the density measured by Archimedes method was 99.7% based on a theoretical density of 4.56 g/cm$^3$. Moreover, as a result of measuring the total light transmittance of the resulting phosphor plate according to the following criteria, the total light transmittance at a wavelength of 700 nm was 66%.

(Sintered Density of Phosphor Plate)

Using an electronic balance (item No. XP-504 manufactured by METTLER TOLEDO Inc.) and a kit for specific gravity measurement capable of being attached thereto (Density determination kit for Excellence XP/XS analytical balances item No. 210260 manufactured by METTLER TOLEDO Inc.), the sintered density of the phosphor plate was measured by Archimedes method. Specifically, using the kit for specific gravity measurement, the weight of a sample in the air and the weight when it was immersed in distilled water were measured and the sintered density was calculated according to the method described in the handling manual annexed to the kit. As all the data of the density of distilled water (temperature dependency), air density, and the like necessary for the calculation, values described in the manual of the kit for specific gravity measurement were used. The sample size was about 10 mmϕ and the thickness was about 300 μm.

(Total Light Transmittance of Phosphor Plate)

A multi channel photo detector system (MCPD 7000 manufactured by Otsuka Electronics Co., Ltd.) and a transmittance measurement stage (manufactured by Otsuka Electronics Co., Ltd.) equipped with an integrating sphere having an inner diameter of 3 inches (see FIG. 5) were connected each other using a dedicated optical fiber and the total light transmittance was measured in the wavelength range of 380 nm to 1,000 nm. While a spot size of incident light at measurement was adjusted to about 2 mmϕ and the transmittance in a state that no sample was place was regarded as 100%, the total light transmittance of each sample was measured. Although the total light transmittance showed wavelength dependency in association with the absorption of the phosphor, for example, in the case where the phosphor plate is a YAG:Ce plate, a value at 700 nm, which is a wavelength where the plate shows no absorption, was adopted as a measure for evaluating transparency (diffusivity) of a sample.

<<Preparation of Phosphor Sheet (YAG Sheet)>>

A solution where a commercially available YAG phosphor powder (item No. BYW01A manufactured by Phosphor Tech Corporation, average particle diameter: 9 μm) had been dispersed in a two-component mixing type thermosetting silicone elastomer (item No. KER 2500 manufactured by Shin-Etsu Silicone) in a concentration of 20% by weight was applied on a glass plate using an applicator in a thickness of about 200 μm and was heated at 100° C. for 1 hour and at 150° C. for 1 hour, thereby obtaining a silicone resin sheet containing the phosphor (phosphor sheet).

As a result of measuring the total light transmittance of the phosphor sheet in accordance with the measurement of the total light transmittance of the phosphor plate, the total light transmittance at a wavelength of 700 nm was 59%.

<<Preparation of LED Element>>

(One-Blue-LED Mounted Type)

An LED element (one-blue-LED mounted type) was prepared. Namely, there was prepared a blue LED element where one piece of a blue LED chip (item No. C450EX1000-0123 manufactured by CREE Inc., size: 980 μm×980 μm, chip thickness: about 100 μm) was mounted on the center of a BT (triazine bismaleimide) resin substrate having a size of 15 mm×15 mm and a thickness of 1.5 mm. Incidentally, a lead is formed of Cu whose surface was protected with Ni/Au, the LED chip is die-bonded on the lead with a silver paste, and a counter electrode is wire-bonded on the lead with a gold wire.

(Four-Blue-LEDs Mounted Type)

Figure 13:
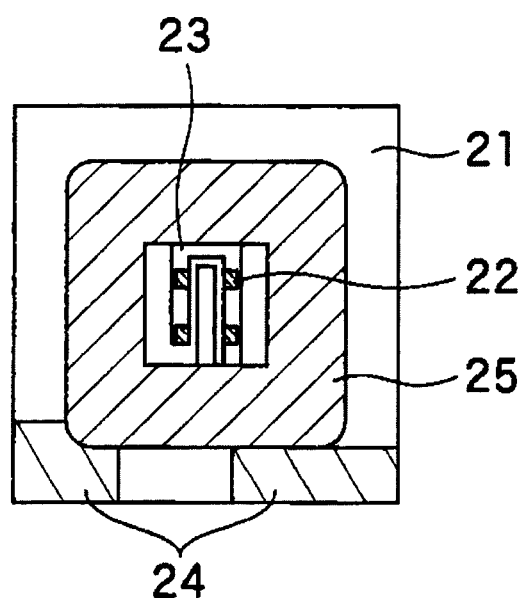
FIG. 13 is a schematic view of an LED element (a four-blue-LEDs mounted type).

An LED element (four-blue-LEDs mounted type) shown in FIG. 13 was prepared. Namely, there was prepared a blue LED element where two pieces of blue LED chips (item No. C450EX1000-0123 manufactured by CREE Inc., size: 980 μm×980 μm, chip thickness: about 100 μm) 22 in a longitudinal direction and two pieces thereof in a transverse direction, 4 pieces thereof in total were mounted on the center of a BT (triazine bismaleimide) resin substrate 21 having a size of 35 mm×35 mm and a thickness of 1.5 mm at intervals of 4 mm. Moreover, in order to prevent a resin from flowing out at the formation of an encapsulating resin layer or a diffusive reflection resin layer, a flame 25 made of a glass epoxy (FR4) and having a thickness of 0.5 mm, an outer diameter of 25 mm×25 mm, and an inner diameter of 10 mm×10 mm was attached. A lead 23 is formed of Cu whose surface was protected with Ni/Au, the LED chip 22 is die-bonded on the lead 23 with a silver paste, and a counter electrode 24 is wire-bonded on the lead 23 with a gold wire. Thus, the LED element (four-blue-LEDs mounted type) shown in FIG. 13 was prepared.

(Sixteen-Blue-LEDs Mounted Type)

Figure 14:
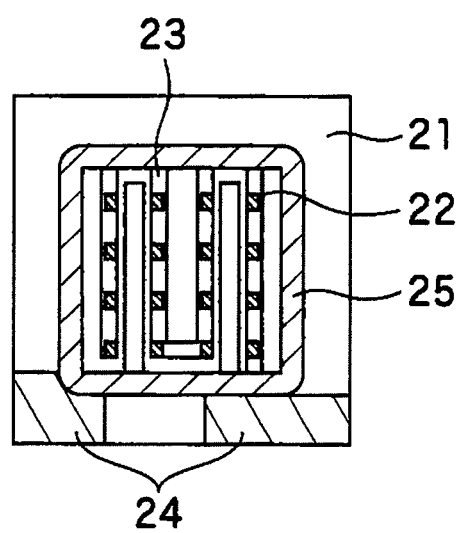
FIG. 14 is a schematic view of an LED element (a sixteen-blue-LEDs mounted type).

An LED element (sixteen-blue-LEDs mounted type) shown in FIG. 14 was prepared in accordance with the production method of the LED element (four-blue-LEDs mounted type) of FIG. 13 except that sixteen pieces of the blue LEDs were used instead of four pieces of the blue LEDs. Namely, there was prepared a blue LED element where four pieces of the blue LED chips 22 in a longitudinal direction and four pieces thereof in a transverse direction, sixteen pieces thereof in total were mounted on the center of the BT resin substrate 21 having a size of 35 mm×35 mm and a thickness of 1.5 mm at intervals of 4 mm. Moreover, a flame 25 made of a glass epoxy (FR4) and having a thickness of 0.5 mm, an outer diameter of 25 mm×25 mm, and an inner diameter of 20 mm×20 mm was attached in the same manner as in the case of the four-blue-LEDs mounted type. Thus, the LED element (sixteen-blue-LEDs mounted type) shown in FIG. 14 was produced.

<<Preparation of Resin Composition for Diffusive Reflection Resin Layer Formation>>

Barium titanate particles (item No. BT-03 manufactured by Sakai Chemical Industry Co., Ltd., adsorption specific surface area value: 3.7 g/m$^2$, refractive index: 2.4) was added to a two-component mixing type thermosetting silicone elastomer (item No. KER 2500 manufactured by Shin-Etsu Silicone, refractive index: 1.41) in an amount of 55% by weight and the whole was thoroughly stirred and mixed to prepare a resin composition for diffusive reflection resin formation (coating resin solution). The white resin solution was applied on a glass substrate using an applicator in a thickness of 150 μm, 370 μm, or 1,000 μm and then was heated at 100° C. for 1 hour and at 150° C. for 1 hour, thereby obtaining a diffusive reflection resin layer.

Figure 15:
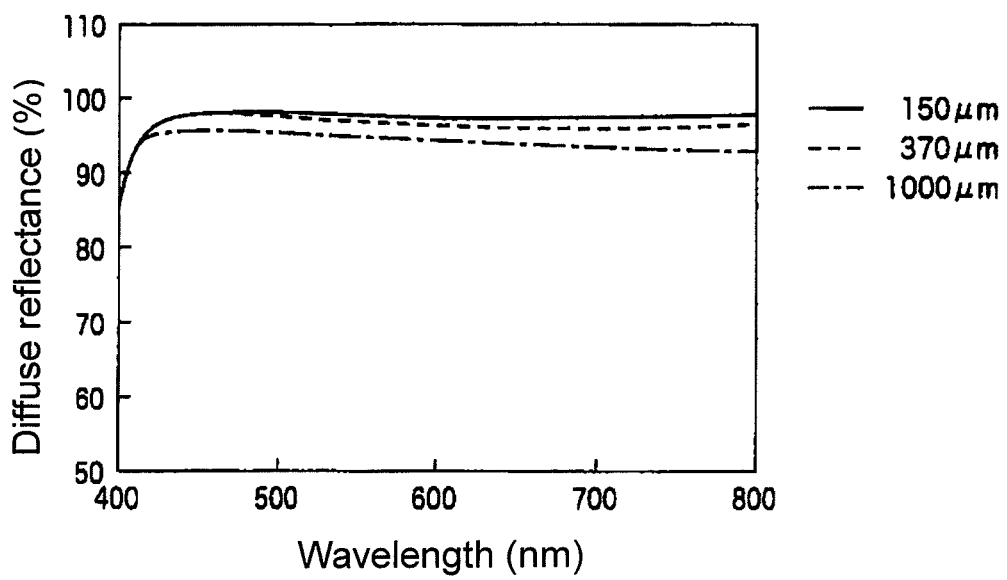
FIG. 15 is a graph diagram showing a relation between the thickness of the diffusive reflection resin layer and the diffuse reflectance.

The diffuse reflectance of the diffusive reflection resin layer (coating layer) was measured according to the following criteria. The results are shown in FIG. 15. From the results in FIG. 15, a sufficiently high diffuse reflectance was obtained even at a thickness of 150 μm and a reflectance of 90% or more was shown in the visible light range except for a wavelength of around 400 nm.

(Diffuse Reflectance of Diffusive Reflection Resin Layer)

A multi channel photo detector system (MCPD 7000 manufactured by Otsuka Electronics Co., Ltd.) and an integrating sphere having an inner diameter of 3 inches were connected each other using a dedicated optical fiber and the diffuse reflectance was measured in the wavelength range of 380 nm to 1,000 nm. First, using a standard diffuse reflection plate (trade name: Spectralon Diffuse Reflectance Standard, item No. SRS-99 manufactured by Labsphere Inc., reflectance: 99%) as a reference, a measured value therefrom was relatively compared with annexed reflectance data and thus diffuse reflectance was measured.

Next, using the above individual materials, LED elements of Examples and Comparative Examples for test were prepared.

Example 1

Using the LED element (four-blue-LEDs mounted type) shown in FIG. 13, an LED element for test was prepared. Namely, first, for the purpose of protecting respective four pieces of the LED chips including wire bonding with the gold wire, a minute amount of a thermosetting silicone elastomer (item No. KER 2500 manufactured by Shin-Etsu Silicone) was attached using a tip of a toothpick and temporarily cured at 100° C. for 15 min. Then, the resin composition for diffusive reflection resin layer formation prepared previously was formed over the whole inner surface (10 mm×10 mm) of the glass epoxy flame. On this occasion, care was taken so that the resin composition did not cover the LED chips. Thereafter, the resin composition was cured by heating at 100° C. for 1 hour and at 150° C. for 1 hour. Then, the silicone elastomer was added dropwise into the glass epoxy flame and a YAG plate diced into a size of 10 mm×10 mm was placed thereon with care so that no air bubbles remained, and was cured under the same conditions to fix the YAG plate, thereby preparing an LED element for test.

Comparative Example 1

An LED element for test was prepared in accordance with Example 1 except that a transparent silicone elastomer (item No. KER 2500 manufactured by Shin-Etsu Silicone) was used instead of the resin composition for diffusive reflection resin layer formation. Namely, the transparent silicone elastomer was formed over the whole inner surface of the glass epoxy flame and then the YAG plate was placed on the LED in the same manner as in Example 1, thereby preparing an LED element for test.

Test Example 1

Using the LED elements produced in Example 1 and Comparative Example 1, emission intensity (emission spectrum) was measured. Namely, a multi channel photo detector system (MCPD 7000 manufactured by Otsuka Electronics Co., Ltd.) and an integrating sphere having an inner diameter of 12 inches were connected each other using a dedicated optical fiber and the emission spectrum of each LED element for test was measured in the wavelength range of 380 nm to 1,000 nm. The LED element for test was placed on the central part in the integrating sphere and a direct current of 80 mA was imparted through a lead wire introduced from a port to perform lightening. After the electric power was supplied, the emission spectrum was recorded after the passage of 10 seconds or more. The results are shown in FIG. 16.

Figure 16:
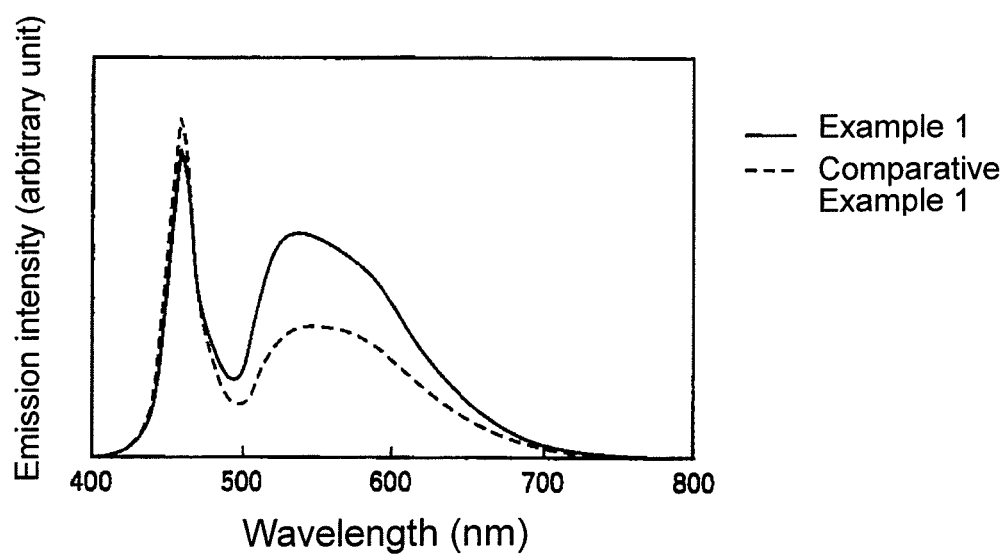
FIG. 16 is a graph diagram showing emission intensity of Example 1 and Comparative Example 1.

From the results in FIG. 16, it was confirmed that the intensity of the emitted light of the yellow component emitted from the YAG plate was particularly increased in the LED elements for test of Example 1 having the diffusive reflection resin layer as compared with the intensity of the LED element for test of Comparative Example 1.

Example 2

An LED element for test was prepared in accordance with Example 1 except that the LED element (sixteen-blue-LEDs mounted type) shown in FIG. 14 was used instead of the LED element (four-blue-LEDs mounted type) shown in FIG. 13. Namely, first, for the purpose of protecting respective sixteen pieces of the LED chips including wire bonding with the gold wire, a minute amount of a thermosetting silicone elastomer (item No. KER 2500 manufactured by Shin-Etsu Silicone) was attached using a tip of a toothpick and temporarily cured at 100° C. for 15 min. Then, the resin composition for diffusive reflection resin layer formation prepared previously was formed all over the whole inner surface (20 mm×20 mm) of the glass epoxy flame. On this occasion, care was taken so that the resin composition did not cover the LED chips. Thereafter, the resin composition was cured by heating at 100° C. for 1 hour and at 150° C. for 1 hour. Then, the silicone elastomer was added dropwise into the glass epoxy flame and a YAG plate having a size of 20 mm×20 mm was placed thereon with care so that no air bubbles remained, and was cured under the same conditions to fix the YAG plate, thereby preparing an LED element for test.

Comparative Example 2

An LED element for test was prepared in accordance with Example 2 except that a transparent silicone elastomer (item No. KER 2500 manufactured by Shin-Etsu Silicone) was used instead of the resin composition for diffusive reflection resin layer formation. Namely, the transparent silicone elastomer was formed over the whole inner surface of the glass epoxy flame and then the YAG plate was placed on the LED in the same manner as in Example 2, thereby preparing an LED element for test.

Test Example 2

Emission intensity (emission spectrum) was measured in accordance with Test Example 1 except that a direct current of 160 mA was imparted to the LED elements for test prepared in Example 2 and Comparative Example 2. The results are shown in FIG. 17.

Figure 17:
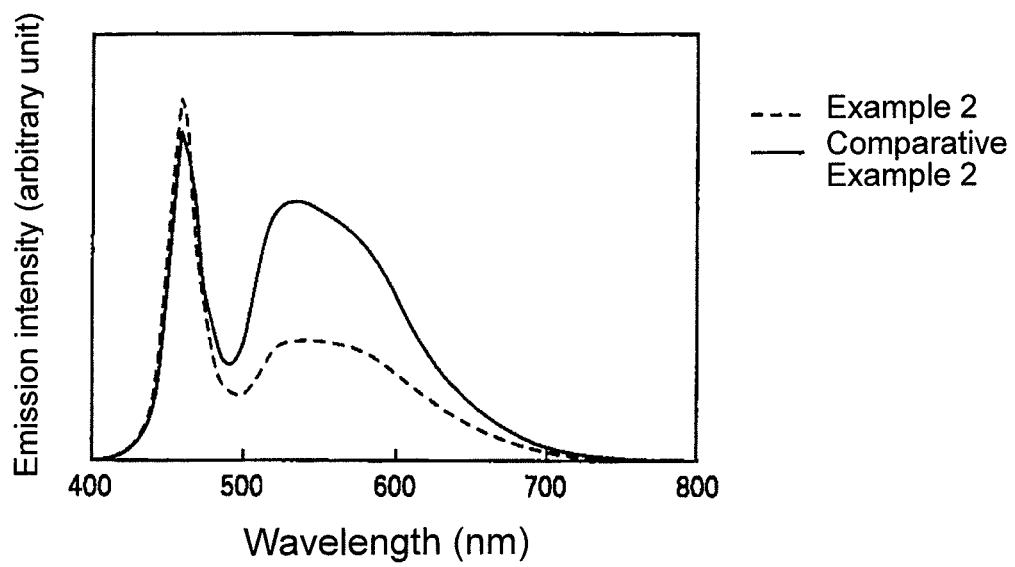
FIG. 17 is a graph diagram showing emission intensity of Example 2 and Comparative Example 2.

From the results in FIG. 17, it was confirmed that the intensity of the emitted light of the yellow component emitted from the YAG plate was particularly increased in the LED elements for test of Example 2 having the diffusive reflection resin layer as compared with the intensity of the LED element for test of Comparative Example 2.

Example 3

An LED element for test was prepared in accordance with Example 2 except that the phosphor sheet (YAG sheet) having a size of 20 mm×20 mm was used instead of the phosphor plate (YAG plate).

Comparative Example 3

An LED element for test was prepared in accordance with Example 3 except that a transparent silicone elastomer (item No. KER 2500 manufactured by Shin-Etsu Silicone) was used instead of the resin composition for diffusive reflection resin layer formation. Namely, the transparent silicone elastomer was formed over the whole inner surface of the glass epoxy flame and then the YAG plate was placed on the LED in the same manner as in Example 3, thereby preparing an LED element for test.

Test Example 3

Emission intensity (emission spectrum) was measured in accordance with Test Example 1 except that a direct current of 160 mA was imparted to the LED elements for test prepared in Example 3 and Comparative Example 3. The results are shown in FIG. 18.

Figure 18:
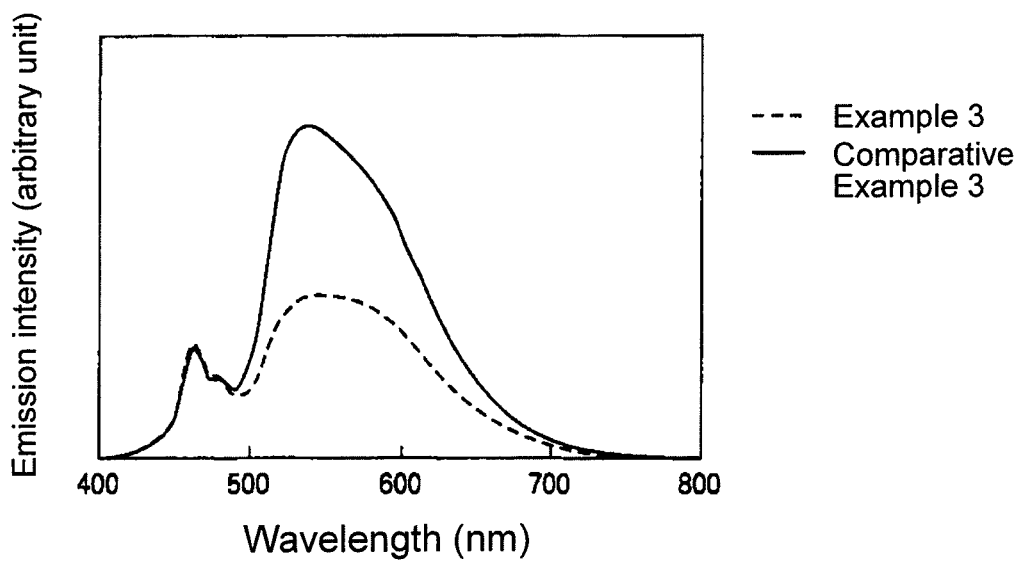
FIG. 18 is a graph diagram showing emission intensity of Example 3 and Comparative Example 3.

From the results in FIG. 18, it was confirmed that the intensity of the emitted light of the yellow component emitted from the YAG sheet was particularly increased in the case of the LED elements for test of Example 3 prepared using the composite film of the invention as compared with the intensity in the case of the LED element for test of Comparative Example 3. Thus, it was confirmed that a similar effect was obtained even when the phosphor sheet (YAG sheet) was used instead of the phosphor plate (YAG plate).

Example 4

An LED element for test was prepared in accordance with Example 1 except that the aforementioned LED element (one-blue-LED mounted type) was used instead of the LED element (four-blue-LEDs mounted type) shown in FIG. 13. Namely, as in Example 1, after the LED chip was protected with a minute amount of a thermosetting silicone elastomer, a diffusive reflection resin layer was formed so that the vicinity of the LED was surrounded. Then, a phosphor plate (YAG plate) diced into a size of 2 mm×2 mm was placed on the center of the LED via the silicone elastomer and the elastomer was cured under the same conditions to fix the YAG plate, thereby preparing an LED element for test. In this regard, the size of light emitting area on the upper surface of the blue LED element is about 1 mm×1 mm, so that the area of the YAG plate (2 mm×2 mm=4 $mm^2$) is about four times by area ratio as compared with the area (1 $mm^2$) of light emitting area of the blue LED element.

Example 5

An LED element for test was prepared in accordance with Example 4 except that a phosphor plate diced into a size of 3 mm×3 mm was used. In this regard, the area of the YAG plate (3 mm×3 mm=9 $mm^2$) is about nine times by area ratio as compared with the area (1 $mm^2$) of light emitting area of the blue LED element.

Comparative Example 4

An LED element for test was prepared in the same manner as in Example 4 except that a phosphor plate diced into a size of 1.2 mm×1.2 mm was used. In this regard, the area of the YAG plate (1.2 mm×1.2 mm=1.44 $mm^2$) is about 1.44 times by area ratio as compared with the area (1 $mm^2$) of light emitting area of the blue LED element.

Comparative Example 5

An LED element for test was prepared in accordance with Example 4 except that a transparent silicone elastomer (item No. KER 2500 manufactured by Shin-Etsu Silicone) was used instead of the resin composition for diffusive reflection resin layer formation. Namely, the transparent silicone elastomer was formed over the whole inner surface of the glass epoxy flame and then the YAG plate was placed on the LED in the same manner as in Example 4, thereby preparing an LED element for test.

Test Example 4

Emission intensity (emission spectrum) was measured in accordance with Test Example 1 except that a direct current of 20 mA was imparted to the LED elements for test prepared in Examples 4 and 5 and Comparative Examples 4 and 5. The results are shown in FIG. 19.

Figure 19:
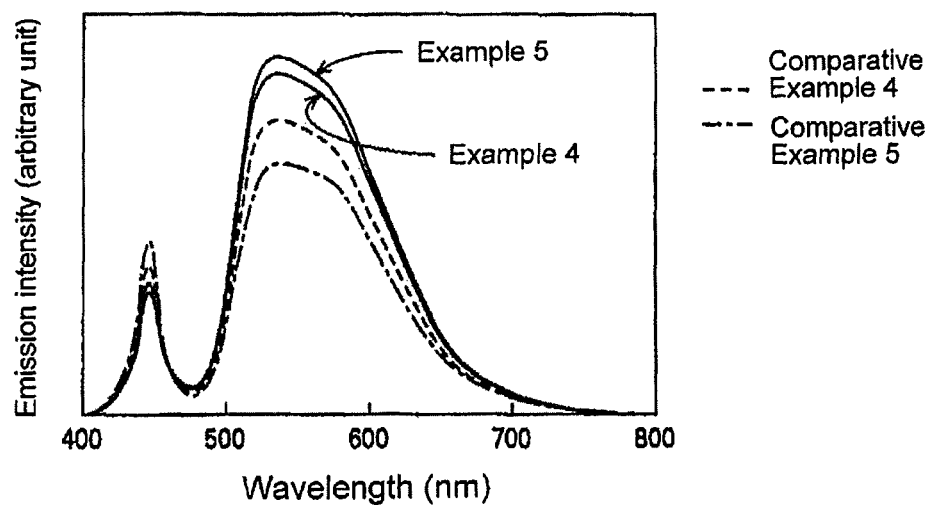
FIG. 19 is a graph diagram showing emission intensity of Examples 4 and 5 and Comparative Examples 4 and 5.
Figure 20:
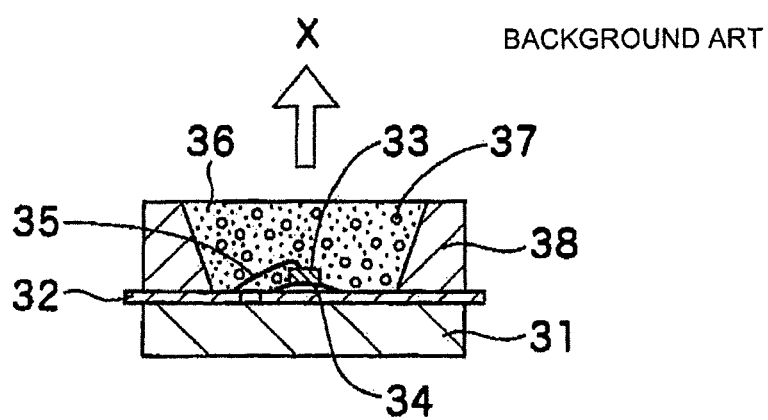
FIG. 20 is a schematic view showing a configuration of a general surface-mounted LED element.
Figure 21:
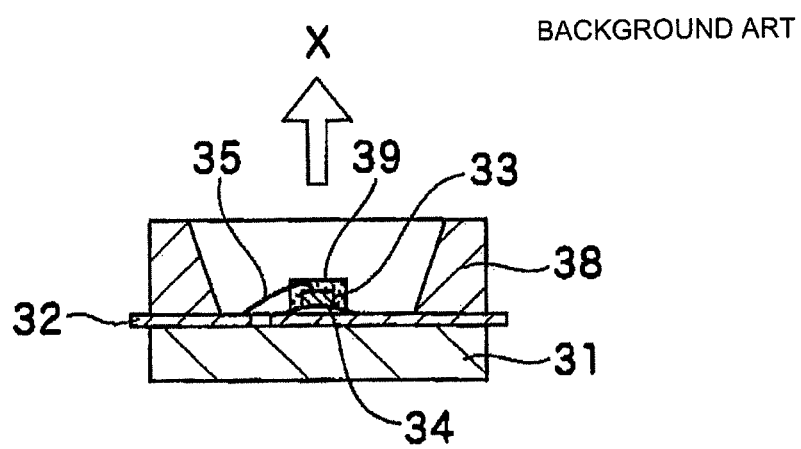
FIG. 21 is a schematic view showing a configuration of a chip-coated type LED element.
Figure 22:
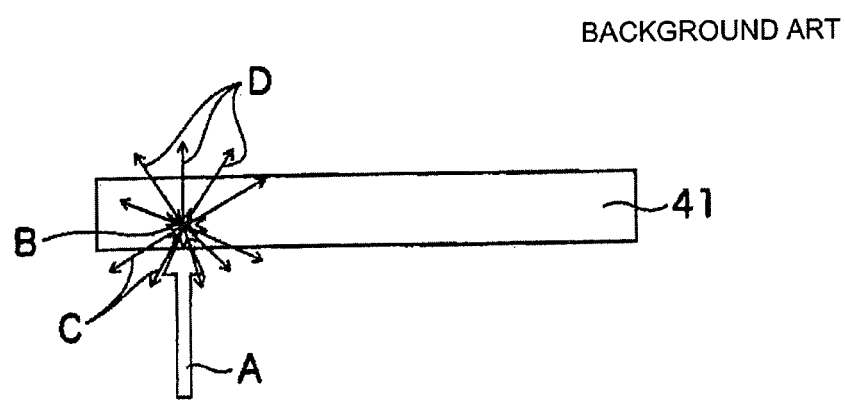
FIG. 22 is a schematic view showing behavior of the light emitted at the wavelength conversion layer at the time when the excitation light from the LED enters into the wavelength conversion layer having a strong diffusivity.
Figure 23:
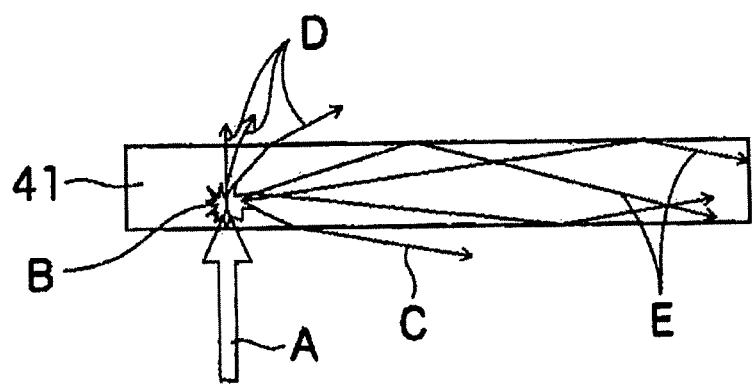
FIG. 23 is a schematic view showing behavior of the light emitted at the wavelength conversion layer at the time when the excitation light from the LED enters into the wavelength conversion layer having a low diffusivity and a high transmittance.

From the results in FIG. 19, it was confirmed that the intensity of the emitted light of the yellow component emitted from the YAG plate was particularly increased in the case of the LEDs elements for test of Examples 4 and 5 having the diffusive reflection resin layer as compared with the intensity in the case of the LED element for test of Comparative Example 5 having no diffusive reflection resin layer. Moreover, since Comparative Example 4 has the diffusive reflection resin layer, emission intensity is superior to that of Comparative Example 5. However, since the area of the YAG plate is too small as compared with the area of the LED element, the intensity of the emitted light of the yellow component emitted from the YAG plate was inferior as compared with the LED elements of Comparative Examples 4 and 5.

Incidentally, the present inventors confirmed from experiments that the intensity of the emitted light of the yellow component emitted from the YAG plate was superior as compared with the LED element of Comparative Example 4 even when a YAG plate where the area of the YAG plate at the LED element face side is twice larger by area ratio than the area of light emitting area on the upper surface of the LED element is used instead of the YAG plates of Examples 4 and 5.

While the invention has been described in detail with reference to specific embodiments thereof, it will be apparent to one skilled in the art that various changes and modifications can be made therein without departing from the spirit and scope thereof.

The semiconductor light emitting device of the invention is suitably used as light sources of backlights for liquid crystal displays, various lighting equipments, headlights for automobiles, advertising displays, flashlights for digital cameras, and the like.

DESCRIPTION OF REFERENCE NUMERALS AND SIGNS

1 Wavelength conversion layer
2 Diffusive reflection resin layer
4 Encapsulating resin layer
5 LED element
6 Printed wiring board
7 Reflector

What is claimed is:
1. A semiconductor light emitting device comprising:
a substrate for element mounting;
a wiring formed on the substrate;
a reflector formed on the substrate having a cavity;
a diffusive reflection resin layer formed in the cavity and having at least one opening;
at least one light emitting diode (LED) element formed in the at least one opening, respectively, and electrically connected to the wiring;
a wavelength conversion structure formed on the diffusive reflection resin layer and sealed the at least one opening, wherein the wavelength conversion structure containing a phosphor material and converting a wavelength of light emitted by the at least one LED element,
an encapsulating resin layer formed in the cavity, wherein the encapsulating resin layer including a first portion and a second portion, wherein the first portion filled in the at least one opening and encapsulated the at least one LED element, wherein the second portion covers the wavelength conversion structure and the diffusive reflection resin layer;
wherein the at least one LED element including a light emitting region on a first surface facing the wavelength conversion layer,
wherein the diffusive reflection resin layer is formed from a cured material of a resin composition containing a transparent resin and an inorganic filler different in refractive index from the transparent resin, and a diffuse reflectance of the diffusive reflection resin layer is 80% or more at the wavelength of 430 nm, and wherein the wavelength conversion structure is a phosphor plate and comprising a translucent ceramic, the translucent ceramic including a polycrystalline sintered body, and the phosphor plate having a sintered density of 99.0% or more, a total light transmittance of 40% or more in a visible light wavelength region excluding an excitation wavelength region, and a thickness of 100 μm to 1,000 μm.

2. The semiconductor light emitting device according to claim 1, wherein an area of a surface of the wavelength conversion structure facing the at least one LED element is at least five times as large as an area of the light emitting region of the at least one LED element.

3. The semiconductor light emitting device according to claim 1, wherein an area of a surface of the wavelength conversion structure facing the at least one LED element is at least twenty times as large as an area of the light emitting region of the at least one LED element.

4. The semiconductor light emitting device according to claim 1, wherein the wavelength conversion structure comprises a single wavelength conversion layer or a laminate of a plurality of wavelength conversion layers.

5. The semiconductor light emitting device according to claim 4, wherein each of the at least one LED element and the at least one opening are formed in plurality.

6. The semiconductor light emitting device according to claim 1, wherein an area of a surface of the wavelength conversion structure facing the at least one LED element is at least twice as large as an area of the light emitting region of the at least one LED element.

* * * * *